United States Patent
David et al.

(10) Patent No.: US 9,411,025 B2
(45) Date of Patent: *Aug. 9, 2016

(54) INTEGRATED CIRCUIT PACKAGE HAVING A SPLIT LEAD FRAME AND A MAGNET

(71) Applicant: Allegro Microsystems, LLC, Worcester, MA (US)

(72) Inventors: Paul David, Bow, NH (US); Ravi Vig, Bow, NH (US); William P. Taylor, Amherst, NH (US); Andreas P. Friedrich, Metz-Tessy (FR)

(73) Assignee: Allegro Microsystems, LLC, Worcester, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/871,131

(22) Filed: Apr. 26, 2013

(65) Prior Publication Data

US 2014/0320124 A1    Oct. 30, 2014

(51) Int. Cl.
*G01R 33/09* (2006.01)
*G01R 33/00* (2006.01)

(52) U.S. Cl.
CPC .......... *G01R 33/093* (2013.01); *G01R 33/0047* (2013.01); *H01L 2224/32245* (2013.01); *H01L 2224/48247* (2013.01); *H01L 2224/73265* (2013.01)

(58) Field of Classification Search
CPC ........... H01L 2224/73265; H01L 2224/32245; H01L 43/08; H01L 2924/00; H01L 2224/48247; G01R 33/09
USPC .......................... 257/666, 421, 427, 108, 698
See application file for complete search history.

(56) References Cited

U.S. PATENT DOCUMENTS

| | | |
|---|---|---|
| 3,195,043 A | 7/1965 | Burig et al. |
| 3,281,628 A | 10/1966 | Bauer et al. |
| 3,607,528 A | 9/1971 | Gassaway |
| 3,627,901 A | 12/1971 | Happ |
| 3,661,061 A | 5/1972 | Tokarz |
| 3,728,786 A | 4/1973 | Lucas et al. |
| 4,048,670 A | 9/1977 | Eysermans |
| 4,188,605 A | 2/1980 | Stout |
| 4,204,317 A | 5/1980 | Winn |
| 4,210,926 A | 7/1980 | Hacke |

(Continued)

FOREIGN PATENT DOCUMENTS

| | | |
|---|---|---|
| CH | 683 469 A5 | 3/1994 |
| DE | 32 43 039 | 11/1982 |

(Continued)

OTHER PUBLICATIONS

Final Office Action dated Mar. 11, 2014; for U.S. Appl. No. 12/360,889 23 pages.

(Continued)

*Primary Examiner* — Chuong A Luu
*Assistant Examiner* — Rodolfo Fortich
(74) *Attorney, Agent, or Firm* — Daly, Crowley, Mofford & Durkee, LLP

(57) ABSTRACT

A magnetic field sensor includes a lead frame having a plurality of leads, at least two of which have a connection portion and a die attach portion. A semiconductor die is attached to the die attach portion of the at least two leads and a separately formed ferromagnetic element, such as a magnet, is disposed adjacent to the lead frame.

63 Claims, 8 Drawing Sheets

(56) References Cited

U.S. PATENT DOCUMENTS

| | | |
|---|---|---|
| 4,262,275 A | 4/1981 | DeMarco et al. |
| 4,283,643 A | 8/1981 | Levin |
| 4,315,523 A | 2/1982 | Mahawili et al. |
| 4,409,608 A | 10/1983 | Yoder |
| 4,425,596 A | 1/1984 | Satou |
| 4,573,258 A | 3/1986 | Io et al. |
| 4,614,111 A | 9/1986 | Wolff |
| 4,642,716 A | 2/1987 | Wakabayashi et al. |
| 4,670,715 A | 6/1987 | Fuzzell |
| 4,719,419 A | 1/1988 | Dawley |
| 4,733,455 A | 3/1988 | Nakamura et al. |
| 4,745,363 A | 5/1988 | Carr et al. |
| 4,746,859 A | 5/1988 | Malik |
| 4,769,344 A | 9/1988 | Sakai et al. |
| 4,772,929 A | 9/1988 | Manchester |
| 4,789,826 A | 12/1988 | Willett |
| 4,796,354 A | 1/1989 | Yokoyama et al. |
| 4,893,073 A | 1/1990 | McDonald et al. |
| 4,908,685 A | 3/1990 | Shibasaki et al. |
| 4,910,861 A | 3/1990 | Dohogne |
| 4,935,698 A | 6/1990 | Kawaji et al. |
| 4,983,916 A | 1/1991 | Iijima et al. |
| 4,994,731 A | 2/1991 | Sanner |
| 5,010,263 A | 4/1991 | Murata |
| 5,012,322 A | 4/1991 | Guillotte |
| 5,021,493 A | 6/1991 | Sandstrom |
| 5,028,868 A | 7/1991 | Murata et al. |
| 5,041,780 A | 8/1991 | Rippel |
| 5,045,920 A | 9/1991 | Vig et al. |
| 5,068,712 A | 11/1991 | Murakami et al. |
| 5,078,944 A | 1/1992 | Yoshino |
| 5,084,289 A | 1/1992 | Shin et al. |
| 5,121,289 A | 6/1992 | Gagliardi |
| 5,124,642 A | 6/1992 | Marx |
| 5,137,677 A | 8/1992 | Murata |
| 5,139,973 A | 8/1992 | Nagy et al. |
| 5,167,896 A | 12/1992 | Hirota et al. |
| 5,185,919 A | 2/1993 | Hickey |
| 5,196,794 A | 3/1993 | Murata |
| 5,196,821 A | 3/1993 | Partin et al. |
| 5,210,493 A | 5/1993 | Schroeder et al. |
| 5,216,405 A | 6/1993 | Schroeder et al. |
| 5,244,834 A | 9/1993 | Suzuki et al. |
| 5,247,202 A | 9/1993 | Popovic et al. |
| 5,250,925 A * | 10/1993 | Shinkle ........................ 338/32 R |
| 5,286,426 A | 2/1994 | Rano, Jr. et al. |
| 5,289,344 A | 2/1994 | Gagnon et al. |
| 5,315,245 A | 5/1994 | Schroeder et al. |
| 5,332,965 A | 7/1994 | Wolf et al. |
| 5,399,905 A | 3/1995 | Honda et al. |
| 5,414,355 A | 5/1995 | Davidson et al. |
| 5,434,105 A | 7/1995 | Liou |
| 5,442,228 A | 8/1995 | Pham et al. |
| 5,453,727 A | 9/1995 | Shibasaki et al. |
| 5,479,695 A | 1/1996 | Grader et al. |
| 5,488,294 A | 1/1996 | Liddell et al. |
| 5,491,633 A | 2/1996 | Henry et al. |
| 5,497,081 A | 3/1996 | Wolf et al. |
| 5,500,589 A | 3/1996 | Sumcad |
| 5,500,994 A | 3/1996 | Itaya |
| 5,508,611 A | 4/1996 | Schroeder et al. |
| 5,539,241 A | 7/1996 | Abidi et al. |
| 5,551,146 A | 9/1996 | Kawabata et al. |
| 5,561,366 A | 10/1996 | Takahashi et al. |
| 5,563,199 A | 10/1996 | Harada et al. |
| 5,579,194 A | 11/1996 | Mackenzie et al. |
| 5,581,170 A | 12/1996 | Mammano et al. |
| 5,581,179 A | 12/1996 | Engel et al. |
| 5,612,259 A | 3/1997 | Okutomo et al. |
| 5,614,754 A | 3/1997 | Inoue |
| 5,615,075 A | 3/1997 | Kim |
| 5,627,315 A | 5/1997 | Figi et al. |
| 5,631,557 A | 5/1997 | Davidson |
| 5,648,682 A | 7/1997 | Nakazawa et al. |
| 5,666,004 A | 9/1997 | Bhattacharyya et al. |
| 5,691,637 A | 11/1997 | Oswald et al. |
| 5,691,869 A | 11/1997 | Engel et al. |
| 5,712,562 A | 1/1998 | Berg |
| 5,714,102 A | 2/1998 | Highum et al. |
| 5,714,405 A | 2/1998 | Tsubosaki et al. |
| 5,719,496 A | 2/1998 | Wolf |
| 5,726,577 A | 3/1998 | Engel et al. |
| 5,729,128 A | 3/1998 | Bunyer et al. |
| 5,729,130 A | 3/1998 | Moody et al. |
| 5,757,181 A | 5/1998 | Wolf et al. |
| 5,781,005 A | 7/1998 | Vig et al. |
| 5,789,658 A | 8/1998 | Henn et al. |
| 5,789,915 A | 8/1998 | Ingraham |
| 5,804,880 A | 9/1998 | Mathew |
| 5,817,540 A | 10/1998 | Wark |
| 5,818,222 A | 10/1998 | Ramsden |
| 5,818,223 A | 10/1998 | Wolf |
| 5,822,849 A | 10/1998 | Casali et al. |
| 5,834,832 A | 11/1998 | Kweon et al. |
| 5,839,185 A | 11/1998 | Smith et al. |
| 5,841,276 A | 11/1998 | Makino et al. |
| 5,859,387 A | 1/1999 | Gagnon |
| 5,883,567 A | 3/1999 | Mullins, Jr. |
| 5,886,070 A | 3/1999 | Honkura et al. |
| 5,891,377 A | 4/1999 | Libres et al. |
| 5,912,556 A | 6/1999 | Frazee et al. |
| 5,940,256 A | 8/1999 | MacKenzie et al. |
| 5,943,557 A | 8/1999 | Moden |
| 5,963,028 A | 10/1999 | Engel et al. |
| 5,973,388 A | 10/1999 | Chew et al. |
| 6,005,383 A | 12/1999 | Savary et al. |
| 6,016,055 A | 1/2000 | Jager et al. |
| 6,043,646 A | 3/2000 | Jansseune |
| 6,057,997 A | 5/2000 | MacKenzie et al. |
| 6,066,890 A | 5/2000 | Tsui et al. |
| 6,097,109 A | 8/2000 | Fendt et al. |
| 6,107,793 A | 8/2000 | Yokotani et al. |
| 6,136,250 A | 10/2000 | Brown |
| 6,150,714 A | 11/2000 | Andreycak et al. |
| 6,175,233 B1 | 1/2001 | McCurley et al. |
| 6,178,514 B1 | 1/2001 | Wood |
| 6,180,041 B1 | 1/2001 | Takizawa |
| 6,184,679 B1 | 2/2001 | Popovic et al. |
| 6,198,373 B1 | 3/2001 | Ogawa et al. |
| 6,225,701 B1 | 5/2001 | Hori et al. |
| 6,252,389 B1 | 6/2001 | Baba et al. |
| 6,265,865 B1 | 7/2001 | Engel et al. |
| 6,278,269 B1 | 8/2001 | Vig et al. |
| 6,294,824 B1 | 9/2001 | Brooks et al. |
| 6,316,736 B1 | 11/2001 | Jairazbhoy et al. |
| 6,316,931 B1 | 11/2001 | Nakagawa et al. |
| 6,323,634 B1 | 11/2001 | Nakagawa et al. |
| 6,331,451 B1 | 12/2001 | Fusaro et al. |
| 6,356,068 B1 | 3/2002 | Steiner et al. |
| 6,359,331 B1 | 3/2002 | Rinehart et al. |
| 6,365,948 B1 | 4/2002 | Kumagai et al. |
| 6,377,464 B1 | 4/2002 | Hashemi et al. |
| 6,388,336 B1 | 5/2002 | Venkateshwaran et al. |
| 6,396,712 B1 | 5/2002 | Kuijk |
| 6,411,078 B1 | 6/2002 | Nakagawa et al. |
| 6,420,779 B1 | 7/2002 | Sharma et al. |
| 6,424,018 B1 | 7/2002 | Ohtsuka |
| 6,429,652 B1 | 8/2002 | Allen et al. |
| 6,445,171 B2 | 9/2002 | Sandquist et al. |
| 6,452,381 B1 | 9/2002 | Nakatani et al. |
| 6,462,531 B1 | 10/2002 | Ohtsuka |
| 6,480,699 B1 | 11/2002 | Lovoi |
| 6,482,680 B1 | 11/2002 | Khor et al. |
| 6,486,535 B2 | 11/2002 | Liu |
| 6,501,268 B1 | 12/2002 | Edelstein et al. |
| 6,501,270 B1 | 12/2002 | Opie |
| 6,504,366 B1 | 1/2003 | Bodin et al. |
| 6,545,332 B2 | 4/2003 | Huang |
| 6,545,456 B1 | 4/2003 | Radosevich et al. |
| 6,545,457 B2 | 4/2003 | Goto et al. |
| 6,545,462 B2 | 4/2003 | Schott et al. |
| 6,563,199 B2 | 5/2003 | Yasunaga et al. |
| 6,566,856 B2 | 5/2003 | Sandquist et al. |
| 6,580,159 B1 | 6/2003 | Fusaro et al. |

(56) References Cited

U.S. PATENT DOCUMENTS

| | | |
|---|---|---|
| 6,583,572 B2 | 6/2003 | Veltrop et al. |
| 6,593,545 B1 | 7/2003 | Greenwood et al. |
| 6,605,491 B1 | 8/2003 | Hsieh et al. |
| 6,608,375 B2 | 8/2003 | Terui et al. |
| 6,610,923 B1 | 8/2003 | Nagashima et al. |
| 6,617,846 B2 | 9/2003 | Hayat-dawoodi et al. |
| 6,642,609 B1 | 11/2003 | Minamio et al. |
| 6,642,705 B2 | 11/2003 | Kawase |
| 6,661,087 B2 | 12/2003 | Wu |
| 6,667,682 B2 | 12/2003 | Wan et al. |
| 6,683,448 B1 | 1/2004 | Ohtsuka |
| 6,683,452 B2 | 1/2004 | Lee et al. |
| 6,692,676 B1 | 2/2004 | Vig et al. |
| 6,696,952 B2 | 2/2004 | Zirbes |
| 6,713,836 B2 | 3/2004 | Liu et al. |
| 6,714,003 B2 | 3/2004 | Babin |
| 6,727,683 B2 | 4/2004 | Goto et al. |
| 6,737,298 B2 | 5/2004 | Shim et al. |
| 6,747,300 B2 | 6/2004 | Nadd et al. |
| 6,759,841 B2 | 7/2004 | Goto et al. |
| 6,770,163 B1 | 8/2004 | Kuah et al. |
| 6,775,140 B2 | 8/2004 | Shim et al. |
| 6,781,233 B2 | 8/2004 | Zverev et al. |
| 6,781,359 B2 | 8/2004 | Stauth et al. |
| 6,791,313 B2 | 9/2004 | Ohtsuka |
| 6,796,485 B2 | 9/2004 | Seidler |
| 6,798,044 B2 | 9/2004 | Joshi |
| 6,798,057 B2 | 9/2004 | Bolkin et al. |
| 6,798,193 B2 | 9/2004 | Zimmerman et al. |
| 6,809,416 B1 | 10/2004 | Sharma |
| 6,812,687 B1 | 11/2004 | Ohtsuka |
| 6,825,067 B2 | 11/2004 | Ararao et al. |
| 6,828,220 B2 | 12/2004 | Pendse et al. |
| 6,832,420 B2 | 12/2004 | Liu |
| 6,841,989 B2 | 1/2005 | Goto et al. |
| 6,853,178 B2 | 2/2005 | Hayat-Dawoodi |
| 6,861,283 B2 | 3/2005 | Sharma |
| 6,867,573 B1 | 3/2005 | Carper |
| 6,875,634 B2 | 4/2005 | Shim et al. |
| 6,902,951 B2 | 6/2005 | Goller et al. |
| 6,921,955 B2 | 7/2005 | Goto |
| 6,943,061 B1 | 9/2005 | Sirinorakul et al. |
| 6,960,493 B2 | 11/2005 | Ararao et al. |
| 6,974,909 B2 | 12/2005 | Tanaka et al. |
| 6,989,665 B2 | 1/2006 | Goto et al. |
| 6,995,315 B2 | 2/2006 | Sharma et al. |
| 7,005,325 B2 | 2/2006 | Chow et al. |
| 7,006,749 B2 | 2/2006 | Illch et al. |
| 7,026,808 B2 | 4/2006 | Vig et al. |
| 7,031,170 B2 | 4/2006 | Daeche et al. |
| 7,046,002 B1 | 5/2006 | Edelstein |
| 7,075,287 B1 | 7/2006 | Mangtani et al. |
| 7,105,929 B2 | 9/2006 | Shishido et al. |
| 7,112,955 B2 | 9/2006 | Buchhold |
| 7,112,957 B2 | 9/2006 | Bicking |
| 7,129,569 B2 | 10/2006 | Punzalan et al. |
| 7,129,691 B2 | 10/2006 | Shibahara et al. |
| 7,148,086 B2 | 12/2006 | Shim et al. |
| 7,166,807 B2 | 1/2007 | Gagnon et al. |
| 7,193,412 B2 | 3/2007 | Freeman |
| 7,221,045 B2 | 5/2007 | Park et al. |
| 7,242,076 B2 | 7/2007 | Dolan |
| 7,248,045 B2 | 7/2007 | Shoji |
| 7,250,760 B2 | 7/2007 | Ao |
| 7,259,545 B2 | 8/2007 | Stauth et al. |
| 7,259,624 B2 | 8/2007 | Barnett |
| 7,265,531 B2 | 9/2007 | Stauth et al. |
| 7,269,992 B2 | 9/2007 | Lamb et al. |
| 7,279,424 B2 | 10/2007 | Guthrie et al. |
| 7,279,784 B2 | 10/2007 | Liu |
| 7,285,952 B1 | 10/2007 | Hatanaka et al. |
| 7,304,370 B2 | 12/2007 | Imaizumi et al. |
| 7,323,780 B2 | 1/2008 | Daubenspeck et al. |
| 7,323,870 B2 | 1/2008 | Tatschl et al. |
| 7,355,388 B2 | 4/2008 | Ishio |
| 7,358,724 B2 | 4/2008 | Taylor et al. |
| 7,361,531 B2 | 4/2008 | Sharma et al. |
| 7,378,721 B2 | 5/2008 | Frazee et al. |
| 7,378,733 B1 | 5/2008 | Hoang et al. |
| 7,385,394 B2 | 6/2008 | Auburger et al. |
| 7,476,816 B2 | 1/2009 | Doogue et al. |
| 7,476,953 B2 | 1/2009 | Taylor et al. |
| 7,518,493 B2 | 4/2009 | Bryzek et al. |
| 7,557,563 B2 | 7/2009 | Gunn et al. |
| 7,573,112 B2 | 8/2009 | Taylor |
| 7,598,601 B2 | 10/2009 | Taylor et al. |
| 7,676,914 B2 | 3/2010 | Taylor |
| 7,687,882 B2 | 3/2010 | Taylor et al. |
| 7,696,006 B1 | 4/2010 | Hoang et al. |
| 7,700,404 B2 | 4/2010 | Punzalan et al. |
| 7,709,754 B2 | 5/2010 | Doogue et al. |
| 7,750,447 B2 | 7/2010 | Chang et al. |
| 7,768,083 B2 | 8/2010 | Doogue et al. |
| 7,777,607 B2 | 8/2010 | Taylor et al. |
| 7,808,074 B2 | 10/2010 | Knittl |
| 7,816,772 B2 | 10/2010 | Engel et al. |
| 7,816,905 B2 | 10/2010 | Doogue et al. |
| 7,838,973 B2 | 11/2010 | Dimasacat et al. |
| 7,839,141 B2 | 11/2010 | Werth et al. |
| 7,956,604 B2 | 6/2011 | Ausserlechner |
| 8,030,918 B2 | 10/2011 | Doogue et al. |
| 8,035,204 B2 | 10/2011 | Punzalan et al. |
| 8,058,870 B2 | 11/2011 | Sterling |
| 8,063,634 B2 | 11/2011 | Sauber et al. |
| 8,080,993 B2 | 12/2011 | Theuss et al. |
| 8,080,994 B2 | 12/2011 | Taylor et al. |
| 8,093,670 B2 | 1/2012 | Taylor |
| 8,106,654 B2 | 1/2012 | Theuss et al. |
| 8,138,593 B2 | 3/2012 | Pagkaliwangan et al. |
| 8,143,169 B2 | 3/2012 | Engel et al. |
| 8,207,602 B2 | 6/2012 | Chang et al. |
| 8,236,612 B2 | 8/2012 | San Antonio et al. |
| 8,253,210 B2 | 8/2012 | Theuss et al. |
| 8,362,579 B2 | 1/2013 | Theuss et al. |
| 8,461,677 B2 | 6/2013 | Ararao et al. |
| 8,486,755 B2 | 7/2013 | Ararao et al. |
| 8,610,430 B2 | 12/2013 | Werth et al. |
| 8,629,539 B2 | 1/2014 | Milano et al. |
| 8,773,124 B2 | 7/2014 | Ausserlechner |
| 9,116,018 B2 | 8/2015 | Frachon |
| 9,164,156 B2 | 10/2015 | Elian et al. |
| 9,201,123 B2 | 12/2015 | Elian et al. |
| 2001/0028115 A1 | 10/2001 | Yanagawa et al. |
| 2001/0030537 A1 | 10/2001 | Honkura et al. |
| 2001/0052780 A1 | 12/2001 | Hayat-Dawoodi |
| 2002/0005780 A1 | 1/2002 | Ehrlich et al. |
| 2002/0020907 A1 | 2/2002 | Seo et al. |
| 2002/0027488 A1 | 3/2002 | Hayat-Dawoodi et al. |
| 2002/0041179 A1 | 4/2002 | Gohara et al. |
| 2002/0179987 A1 | 12/2002 | Meyer et al. |
| 2002/0195693 A1 | 12/2002 | Liu et al. |
| 2003/0038464 A1 | 2/2003 | Furui |
| 2003/0039062 A1 | 2/2003 | Takahasahi |
| 2003/0067057 A1 | 4/2003 | Wu |
| 2003/0164548 A1 | 9/2003 | Lee |
| 2003/0209784 A1 | 11/2003 | Schmitz et al. |
| 2003/0230792 A1 | 12/2003 | Wu et al. |
| 2004/0032251 A1 | 2/2004 | Zimmerman et al. |
| 2004/0038452 A1 | 2/2004 | Pu |
| 2004/0046248 A1 | 3/2004 | Waelti et al. |
| 2004/0056647 A1 | 3/2004 | Stauth et al. |
| 2004/0080308 A1 | 4/2004 | Goto |
| 2004/0080314 A1 | 4/2004 | Tsujii et al. |
| 2004/0094826 A1 | 5/2004 | Yang et al. |
| 2004/0135220 A1 | 7/2004 | Goto |
| 2004/0135574 A1 | 7/2004 | Hagio et al. |
| 2004/0145043 A1 | 7/2004 | Hayashi et al. |
| 2004/0155644 A1 | 8/2004 | Stauth et al. |
| 2004/0174655 A1 | 9/2004 | Tsai et al. |
| 2004/0184196 A1 | 9/2004 | Jayasekara |
| 2004/0207035 A1 | 10/2004 | Witcraft et al. |
| 2004/0207077 A1 | 10/2004 | Leal et al. |
| 2004/0207398 A1 | 10/2004 | Kudo et al. |
| 2004/0207400 A1 | 10/2004 | Witcraft et al. |

(56) References Cited

U.S. PATENT DOCUMENTS

| | | |
|---|---|---|
| 2004/0212053 A1 | 10/2004 | Koh et al. |
| 2004/0262718 A1 | 12/2004 | Ramakrishna |
| 2004/0263148 A1 | 12/2004 | Takabatake |
| 2005/0035448 A1 | 2/2005 | Hsu et al. |
| 2005/0040814 A1 | 2/2005 | Vig et al. |
| 2005/0045359 A1 | 3/2005 | Doogue et al. |
| 2005/0139972 A1 | 6/2005 | Chiu et al. |
| 2005/0151448 A1 | 7/2005 | Hikida et al. |
| 2005/0167790 A1 | 8/2005 | Khor et al. |
| 2005/0173783 A1 | 8/2005 | Chow et al. |
| 2005/0194676 A1 | 9/2005 | Fukuda et al. |
| 2005/0224248 A1 | 10/2005 | Gagnon et al. |
| 2005/0230843 A1 | 10/2005 | Williams |
| 2005/0236698 A1 | 10/2005 | Ozawa et al. |
| 2005/0248005 A1 | 11/2005 | Hayat-Dawoodi |
| 2005/0248336 A1 | 11/2005 | Sharma et al. |
| 2005/0253230 A1 | 11/2005 | Punzalan et al. |
| 2005/0253507 A1 | 11/2005 | Fujimura et al. |
| 2005/0266611 A1 | 12/2005 | Tu et al. |
| 2005/0270748 A1 | 12/2005 | Hsu |
| 2005/0274982 A1 | 12/2005 | Ueda et al. |
| 2005/0280411 A1 | 12/2005 | Bicking |
| 2006/0002147 A1 | 1/2006 | Hong et al. |
| 2006/0033487 A1 | 2/2006 | Nagano et al. |
| 2006/0038289 A1 | 2/2006 | Hsu et al. |
| 2006/0038560 A1 | 2/2006 | Kurumado |
| 2006/0068237 A1 | 3/2006 | Murphy |
| 2006/0071655 A1 | 4/2006 | Shoji |
| 2006/0077598 A1 | 4/2006 | Taylor et al. |
| 2006/0091993 A1 | 5/2006 | Shoji |
| 2006/0114098 A1 | 6/2006 | Shoji |
| 2006/0125473 A1 | 6/2006 | Frachon et al. |
| 2006/0145690 A1 | 7/2006 | Shoji |
| 2006/0152210 A1 | 7/2006 | Mangtani et al. |
| 2006/0170529 A1 | 8/2006 | Shoji |
| 2006/0175674 A1 | 8/2006 | Taylor |
| 2006/0181263 A1 | 8/2006 | Doogue et al. |
| 2006/0219436 A1 | 10/2006 | Taylor et al. |
| 2006/0232268 A1* | 10/2006 | Arns et al. ............... 324/207.13 |
| 2006/0238190 A1* | 10/2006 | Ishio ........................ 324/207.21 |
| 2006/0255797 A1 | 11/2006 | Taylor et al. |
| 2006/0261801 A1 | 11/2006 | Busch |
| 2006/0267135 A1 | 11/2006 | Wolfgang et al. |
| 2006/0291106 A1 | 12/2006 | Shoji |
| 2007/0007631 A1 | 1/2007 | Knittl |
| 2007/0018290 A1 | 1/2007 | Punzalan et al. |
| 2007/0018642 A1 | 1/2007 | Ao |
| 2007/0044370 A1 | 3/2007 | Shoji |
| 2007/0076332 A1 | 4/2007 | Shoji |
| 2007/0090825 A1 | 4/2007 | Shoji |
| 2007/0099348 A1 | 5/2007 | Sharma et al. |
| 2007/0126088 A1 | 6/2007 | Frazee et al. |
| 2007/0138651 A1 | 6/2007 | Hauenstein |
| 2007/0170533 A1 | 7/2007 | Doogue et al. |
| 2007/0188946 A1 | 8/2007 | Shoji |
| 2007/0241423 A1 | 10/2007 | Taylor et al. |
| 2007/0243705 A1 | 10/2007 | Taylor |
| 2007/0279053 A1 | 12/2007 | Taylor et al. |
| 2008/0013298 A1 | 1/2008 | Sharma et al. |
| 2008/0018261 A1 | 1/2008 | Kastner |
| 2008/0034582 A1 | 2/2008 | Taylor |
| 2008/0036453 A1 | 2/2008 | Taylor |
| 2008/0116884 A1 | 5/2008 | Rettig et al. |
| 2008/0230879 A1 | 9/2008 | Sharma et al. |
| 2008/0237818 A1 | 10/2008 | Engel et al. |
| 2008/0297138 A1 | 12/2008 | Taylor et al. |
| 2009/0001965 A1 | 1/2009 | Ausserlechner et al. |
| 2009/0058412 A1 | 3/2009 | Taylor et al. |
| 2009/0102034 A1 | 4/2009 | Pagkaliwangan |
| 2009/0121704 A1 | 5/2009 | Shibahara |
| 2009/0122437 A1 | 5/2009 | Gong et al. |
| 2009/0140725 A1 | 6/2009 | Ausserlechner |
| 2009/0152696 A1 | 6/2009 | Dimasacat et al. |
| 2009/0294882 A1* | 12/2009 | Sterling ............... G01R 33/072 257/427 |
| 2010/0019332 A1 | 1/2010 | Taylor |
| 2010/0140766 A1 | 6/2010 | Punzalan et al. |
| 2010/0141249 A1* | 6/2010 | Ararao ............... G01R 33/0047 324/244 |
| 2010/0188078 A1 | 7/2010 | Foletto et al. |
| 2010/0201356 A1 | 8/2010 | Koller et al. |
| 2010/0211347 A1 | 8/2010 | Friedrich et al. |
| 2010/0237450 A1 | 9/2010 | Doogue et al. |
| 2010/0276769 A1 | 11/2010 | Theuss et al. |
| 2010/0295140 A1 | 11/2010 | Theuss et al. |
| 2010/0330708 A1 | 12/2010 | Engel et al. |
| 2011/0050222 A1 | 3/2011 | Ueno et al. |
| 2011/0068447 A1 | 3/2011 | Camacho et al. |
| 2011/0111562 A1 | 5/2011 | San Antonio et al. |
| 2011/0127998 A1* | 6/2011 | Elian et al. ..................... 324/219 |
| 2011/0133732 A1 | 6/2011 | Sauber |
| 2011/0175598 A1 | 7/2011 | Doering et al. |
| 2011/0187350 A1 | 8/2011 | Ausserlechner et al. |
| 2011/0204887 A1 | 8/2011 | Ausserlechner et al. |
| 2011/0267040 A1 | 11/2011 | Frachon |
| 2011/0304327 A1 | 12/2011 | Ausserlechner |
| 2012/0013333 A1 | 1/2012 | Ararao et al. |
| 2012/0038352 A1 | 2/2012 | Elian et al. |
| 2012/0086090 A1* | 4/2012 | Sharma et al. ................. 257/421 |
| 2013/0113474 A1 | 5/2013 | Elian |
| 2013/0113475 A1* | 5/2013 | Elian ................. G01R 33/0047 324/244 |
| 2013/0278246 A1 | 10/2013 | Stegerer et al. |

FOREIGN PATENT DOCUMENTS

| | | |
|---|---|---|
| DE | 32 43 039.6 | 5/1984 |
| DE | 3243039 (A1) | 5/1984 |
| DE | 4 141 386 | 6/1993 |
| DE | 102 31 194 | 2/2004 |
| DE | 102 31 194 A1 | 2/2004 |
| DE | 103 14 602 | 10/2004 |
| DE | 103 14 602 A1 | 10/2004 |
| DE | 10 2004 054317 | 5/2006 |
| DE | 10 2004 060 298 | 6/2006 |
| DE | 10 2004 060 298 A1 | 6/2006 |
| DE | 10 2004 060298 A1 | 6/2006 |
| DE | 10 2007 018 238 A1 | 10/2008 |
| DE | 10 2008 064047 A1 | 4/2010 |
| DE | 10 2009 000460 A1 | 7/2010 |
| EP | 0 244 737 | 5/1986 |
| EP | 0 244 737 A2 | 4/1987 |
| EP | 0 361 456 | 4/1990 |
| EP | 0 361 456 A2 | 4/1990 |
| EP | 0409173 A2 | 1/1991 |
| EP | 0 537 419 | 4/1993 |
| EP | 0 680 103 A1 | 11/1995 |
| EP | 0 867 725 | 9/1998 |
| EP | 0 896 180 | 2/1999 |
| EP | 0 898 180 | 2/1999 |
| EP | 0 898 180 A2 | 2/1999 |
| EP | 0944839 | 9/1999 |
| EP | 0 680 103 B1 | 2/2000 |
| EP | 1 107 327 | 6/2001 |
| EP | 1 107 328 | 6/2001 |
| EP | 1 111 693 | 6/2001 |
| EP | 1160887 A2 | 12/2001 |
| EP | 1 180 804 | 2/2002 |
| EP | 1281974 | 2/2003 |
| EP | 1 443 332 | 4/2004 |
| EP | 1 443 332 A1 | 8/2004 |
| EP | 0898180 B1 | 11/2004 |
| EP | 2366976 A1 | 9/2011 |
| FR | 2 748 105 | 10/1997 |
| GB | 2273782 | 6/1994 |
| JP | S 47-12071 | 4/1972 |
| JP | S47-12071 | 4/1972 |
| JP | S 58-501372 | 8/1983 |
| JP | 61-71649 | 4/1986 |
| JP | 62-260374 | 11/1987 |
| JP | S 62-260374 | 11/1987 |
| JP | S63-051647 | 3/1988 |
| JP | 363 084176 A | 4/1988 |
| JP | 63-191069 | 8/1988 |

(56) References Cited

FOREIGN PATENT DOCUMENTS

| | | |
|---|---|---|
| JP | 63-263782 | 10/1988 |
| JP | 1 184885 | 7/1989 |
| JP | 01207909 | 8/1989 |
| JP | H2-124575 | 10/1990 |
| JP | H03-71073 A | 3/1991 |
| JP | 04-152688 | 5/1992 |
| JP | H4-97370 | 8/1992 |
| JP | 04-329682 | 11/1992 |
| JP | 4-329682 | 11/1992 |
| JP | 4-357858 A | 12/1992 |
| JP | 4-364472 | 12/1992 |
| JP | H04-357858 | 12/1992 |
| JP | 05-206185 | 8/1993 |
| JP | 8-97486 | 4/1996 |
| JP | 08-097486 | 4/1996 |
| JP | 8-264569 | 10/1996 |
| JP | 8-264569 A | 10/1996 |
| JP | H08-264569 | 10/1996 |
| JP | 09-079865 | 3/1997 |
| JP | 90979865 | 3/1997 |
| JP | 09-166612 | 6/1997 |
| JP | H10-022422 | 1/1998 |
| JP | 11-074142 | 3/1999 |
| JP | 2000-174357 | 6/2000 |
| JP | 2000-183241 A | 6/2000 |
| JP | 2000-183241 A | 6/2000 |
| JP | 2000-294692 | 10/2000 |
| JP | 2004-055932 | 2/2001 |
| JP | 2001-116815 | 4/2001 |
| JP | 2001-141738 | 5/2001 |
| JP | 2001-141738 A | 5/2001 |
| JP | 2001-165702 | 6/2001 |
| JP | 2001-165963 | 6/2001 |
| JP | 2001-174486 | 6/2001 |
| JP | 2001-230467 | 8/2001 |
| JP | 2001-289865 A | 10/2001 |
| JP | 2001-339109 | 12/2001 |
| JP | 2002-026419 | 1/2002 |
| JP | 2002-040058 | 2/2002 |
| JP | 2002-189069 A | 7/2002 |
| JP | 2002-202306 | 7/2002 |
| JP | 2002-202327 | 7/2002 |
| JP | 2003-177168 | 6/2003 |
| JP | 2003-177171 | 6/2003 |
| JP | 2004-55932 | 2/2004 |
| JP | 2004 055932 A | 2/2004 |
| JP | 2004055932 | 2/2004 |
| JP | 2004-356338 | 12/2004 |
| JP | 2005-327859 A | 11/2005 |
| JP | 2005-337866 | 12/2005 |
| JP | 2005-345302 | 12/2005 |
| JP | 2006-047113 | 2/2006 |
| JP | 2006-164528 | 6/2006 |
| JP | 2007-218799 | 8/2007 |
| JP | 2001 116815 | 4/2014 |
| WO | WO 83/00949 | 3/1983 |
| WO | WO 9007176 | 6/1990 |
| WO | WO 99/14605 | 3/1999 |
| WO | WO 99/14605 A1 | 3/1999 |
| WO | WO 0054068 | 9/2000 |
| WO | WO 0069045 | 11/2000 |
| WO | WO 01/23899 | 4/2001 |
| WO | WO 01/74139 | 10/2001 |
| WO | WO 03/107018 A1 | 12/2003 |
| WO | WO 2004/027436 | 4/2004 |
| WO | WO 2005/013363 | 2/2005 |
| WO | WO 2005/026749 | 3/2005 |
| WO | WO 2006/037695 A1 | 4/2006 |
| WO | WO 2006/060330 A1 | 6/2006 |
| WO | WO 2006/083479 | 8/2006 |
| WO | WO 2008/008140 A2 | 1/2008 |
| WO | WO 2008/008140 A3 | 1/2008 |
| WO | WO 2008/121443 A1 | 10/2008 |
| WO | WO 2010/065315 | 6/2010 |
| WO | WO 2013/142112 | 7/2013 |
| WO | WO 2013/109355 | 9/2013 |
| WO | WO 2013/141981 | 9/2013 |

OTHER PUBLICATIONS

Korean Patent Application No. 10-2009-7021132 Office Action dated Mar. 28, 2014, including partial translation on foreign associate email dated Apr. 1, 2014, 11 pages.

Chinese Patent Application No. 201110285150.8 Notice of Granting Patent Right for Invention dated Apr. 17, 2014, including English translation, 4 pages.

Japanese Patent Application No. 2010-501028 Allowance Report dated May 7, 2014, with foreign associate cover letter, 4 pages.

Response filed Jun. 23, 2014; of Office Action dated Mar. 11, 2014 for Patent U.S. Appl. No. 12/360,889 11 pages.

Korean Patent Application No. 10-2009-7021132 Notice of Allowance dated Sep. 26, 2014, including translation, 6 pages.

International Preliminary Report on Patentability dated Oct. 2, 2014 for PCT Application No. PCT/US2013/030112; 20 pages.

Letter from Yuasa and Hara dated Oct. 29, 2013; for Japanese Pat. App. No. 2011-539582; 2 pages.

Reponse to Office Action (with Claims in English) filed Oct. 15, 2013; for Japanese Pat. App. No. 2011-539582; 13 pages.

Office action dated May 31, 2013 for U.S. Appl. No. 13/350,970; 5 pages.

Response to Office Action filed Jun. 19, 2013 for U.S. Appl. No. 13/350,970;7 pages.

Notice of Allowance dated Sep. 3, 2013 for U.S. Appl. No. 13/350,970;10 pages.

Restriction Requirement dated Jul. 15, 2014 for U.S. Appl. No. 13/350,970; 7 pages.

Response to Restriction Requirement filed Jul. 29, 2014 for U.S. Appl. No. 14/090,037;1 pages.

Office action dated Aug. 14, 2014 for U.S. Appl. No. 14/090,037; 7 pages.

Response filed Jan. 13, 2015 for EP Application EP12809921.5; 18 pages.

Hashemi, "The Close Attached Capacitor; A Solution to Switching Noise Problems" IEEE Transactions on Components, Hybrids, and Manufacturing Technologies, IEEE New York, US vol. 15, No. 6, Dec. 1, 1992 8 pages.

Infineon Technologies, "Differential Two-Wire Hall Effect Sensor-IC for Wheel Speed Applications with Direction Detection" Feb. 2005, Data Sheet. vol. 3.1, 32 pages.

Infineon Technologies, "Smart Hall Effect Sensor Camashaft Applications", 2003 Infineon Technologies AG, Germany 2 pages.

Motz et al., "A chopped Hall Sensor with Small Jitter and Programmable "True Power-On" Function", IEEE Journal of Solid State Circuits, vol. 40, No. 7, Jul. 2005 8 pages.

Wibben J. et al., "A High-Efficiency DC-DC Converter Using 2nH Integrated Inductors". IEEE Journal of Solid State Circuits, IEEE Service Center, Piscataway, NJ, col. 43, No. 4, Apr. 1, 2008 11 pages.

Arnold et al., "Hall Effect Detector and Miniswitch;" IBM Technical Disclosure Bulletin; vol. 117 No. 11; Apr. 1975; 1 page.

Baites; "Future of IC Microtransducers;" Sensors & Actuators A, Elsevier Sequoia S.A Lausanne; No. 1; Aug. 1996; 14 pages.

Blanchard et al.; "Highly Sensitive Hall Sensor in CMOS Technology." Sensors & Actuators A, Elsevier Sequoia S.A Lausanna, CH; vol. 85, No. 1-3; May 2000; 5 pages.

Cheng et al.; "Effects of Spacer Layeron Growth Stress& Magnetic Properties of Sputtered Permalloy Film;" Journal of Magnetism and Magnetic Materials; Elsevier Science Publishers, Amsterdam, NL; vol. 282; Nov. 2004; 6 pages.

Daughton; "GMR & SDT Sensor Applications;" IEEE Transactions on Magnetic, vol. 36, No. 5; Sep. 2000; 6 pages.

Edelstein et al.; "Minimizing 1/$f$ Noise in Magnetic Sensors Using a Microelectromechanical Systems Flux Concentrator," Journal of Applied Physics; American Institute of Physics; New York; US vol. 91. No. 10, May 15, 2002; 3 pages.

(56) References Cited

OTHER PUBLICATIONS

Frick et al.; "40.2: CMOS Microsystems for AC Current Measurement with Galvanic Isolation;" Proceedings of IEEE Sensors 2002; IEEE Int'l Conference on Sensors; New York, NY vol. 1 of 2, Conf. 1; Jun. 12, 2002; 9 pages.
Katyl; "Edge-Mounted Hall Cell Sensor," IBM Technical Disclosure Bulletin; vol. 22, No. 8A; Jan. 1, 1980; 1 page.
Katyl; "Flux Concentrator for Magnetic Field Sensor Transistor," Ip.com Journal, ip.com Inc., West Henrietta, NY; Jun. 1, 1980; 3 Pages.
Leichle et al.; "A Micromachined Resonant Magnetic Field Sensor," Proceedings of the IEEE 14th Annual Int'l Conference on Microelectio Mechanical Systems, MEMS 2001; Interlaken, SH; Jan. 21, 2001; 4 pages.
Popovic et al.; "Inergrated Hall Sensor/ Flux Concentrator Microsystems;" Informacije Midem; Ljubljana, SI; Oct. 10, 2001; 5 pages.
Popovic,; "Not-Plate-Like Hall Magnetic Sensors and their Applications," Sensors & Actuators A, Elsevier Sequoia S.A. Lausanne; CH; vol. 85, No. 1-3; Aug. 25, 2000; 9 pages.
Schneider et al.; "Intergrated Flux Concentrator improves CMOS Magnetotransistor," Proceedings of the Workshop on Micro Electrical Mechanical Systems; NL: Jan. 29, 1995;6 pages.
Lee et al.; "Fine Pitch Au—SnAgCu Joint-in-via Flip-Chip Packaging," IEEE 9th Electronics Packaging Technology Conference, Dec. 10-12, 2007; 7 pages.
Mosbarger et al.; "The Effects of Materials and Post-Mold Profiles on Plastic Encapsulated Integrated Circuits;" IEEE/IRPS; Apr. 1994, 8 pages.
Steiner et al.; "Fully Package CMOS Current Monitor Using Leadon-Chip Technology," Physical Electronics Laboratory, ETHZurich, CH8093 Zurich, Switzerland; No. 0-7803-4412-X/98; IEEE 1998; 6 pages.
Park et al.; "Ferrite-Based Integrated Planar Inductors and Transformers Fabricated at Low Temperature;" IEEE Transactions on Magnetics; vol. 33, No. 5; Sep. 1997; 3 pages.
Response to Office Action dated Jan. 28, 2014 as filed May 28, 2014 for U.S. Appl. No. 13/838,864.
Response to Office Action dated Jan. 9, 2014 as filed May 28, 2014 for U.S. Appl. No. 13/838,131.
Korean Patent Application No. 10-2009-7021132 Response and Amendment filed May 27, 2014, including translation of Amended Claims, Email from Foreign Associate dated Apr. 29, 2014 providing comments, Email to Foreign Associate dated May 23, 2014 providing instruction to amend claims, letter from Foreign Associate instructing Response and Amendment filed May 27, 2014.
Korean Patent Application No. 10-2009-7021132 Email from foreign associate dated Apr. 1, 2014 regarding office action received and listing of references from office action (translation of each reference listed above), 2 pages.
Office Action dated Jul. 17, 2014 for U.S. Appl. No. 13/838,131, filed Mar. 15, 2013.
Office Action dated Jul. 17, 2014 for U.S. Appl. No. 13/838,864, filed Mar. 15, 2013.
U.S. Appl. No. 13/748,999, filed Jan. 24, 2013, Vig et al.
U.S. Appl. No. 13/749,776, filed Jan. 25, 2013, David et al.
U.S. Appl. No. 13/788,210, filed Mar. 7, 2013, Taylor et al.
U.S. Appl. No. 13/468,478, filed May 10, 2012, Pepka et al.
U.S. Appl. No. 13/838,131, filed Mar. 15, 2013, Ararao et al.
U.S. Appl. No. 13/838,864, filed Mar. 15, 2013, Ararao et al.
File Wrapper for U.S. Appl. No. 09/837,991, filed Apr. 19, 2001. U.S. Patent No. 6,692,676, issued Feb. 17, 2004, 231 63 pages.
File Wrapper for U.S. Appl. No. 09/264,254, filed, Mar. 8, 1999, U.S. Patent No. 6,278,269, issued Aug. 21, 2001, 153 pages.
File downloaded from PAIR for U.S. Appl. No. 11/051,124, filed Feb. 4, 2005, U.S. Patent No. 7,476,953, issued Jan. 13, 2009 file through Aug. 6, 2012, 561 pages.
File downloaded from PAIR for U.S. Appl. No. 11/693,183, filed Mar. 29, 2007, U.S. Patent No. 7,816,772 issued Oct. 19, 2012 filed through Jun. 8, 2012, 277 pages.
File downloaded from PAIR for U.S. Appl. No. 12/878,132, filed Sep. 9, 2010, U.S. Patent No. 8,143,169, issued Mar. 27, 2012 file through Jun. 8, 2012, 418 pages, Part 1.
File downloaded from PAIR for U.S. Appl. No. 12/878,132, filed Sep. 9, 2010, U.S. Patent No. 8,143,169, issued Mar. 27, 2012, filed through Jun. 8, 2012, 379 pages, Part 2.
File downloaded from PAIR for U.S. Appl. No. 12/878,134, filed Sep. 9, 2010, U.S. Patent No. 8,143,169, issued Mar. 27, 2012, file through Jun. 8, 2012, 357 pages, Part 3.
File downloaded from PAIR for U.S. Appl. No. 12/878,134, filed Sep. 9, 2010, U.S. Patent No. 8,143,169, issued Mar. 27, 2012, file through Jun. 8, 2012, 430 pages, Part 4.
File downloaded from PAIR for U.S. Appl. No. 12/878,134, filed Sep. 9, 2010, U.S. Patent No. 8,143,169, issued Mar. 27, 2012, file through Jun. 8, 2012, 238 pages, Part 5.
File downloaded from PAIR for U.S. Appl. No. 12/360,889, filed Jan. 28, 2009, file through Aug. 6, 2012, 58 pages.
Office Action; dated Jun. 7, 2012; for U.S. Appl. No. 12/360,889; 9 pages.
Response to Office Action dated Jun. 7, 2012; for U.S. Appl. No. 12/360,889; 12 pages.
Office Action dated Jan. 18, 2013; for U.S. Appl. No. 12/360,889; 7 pages.
Response to Office Action dated Jan. 18, 2013; for U.S. Appl. No. 12/360,889; 6 pages.
Office Action dated Jun. 28, 2013; for U.S. Appl. No. 12/360,889; 7 pages.
File downloaded from PAIR for U.S. Appl. No. 12/328,798, filed Dec. 5, 2008, 428 pages, Part1.
File downloaded from PAIR for U.S. Appl. No. 12/328,798, filed Dec. 5, 2008, file through Jun. 8, 2012, 300 pages, Part2.
File downloaded from PAIR for U.S. Appl. No. 12/328,798, filed Dec. 5, 2008, file through Jun. 8, 2012, 306 pages, Part3.
File downloaded from PAIR for U.S. Appl. No. 12/328,798, filed Dec. 5, 2008, file through Jun. 8, 2012, 434 pages, Part4.
File downloaded from PAIR for U.S. Appl. No. 12/328,798, filed Dec. 5, 2008, file through Jun. 8, 2012, 302 pages, Part5.
File downloaded from PAIR for U.S. Appl. No. 12/328,798, filed Dec. 5, 2008, file through Jun. 8, 2012, 301 pages, Part6.
File downloaded from PAIR for U.S. Appl. No. 12/328,798, filed Dec. 5, 2008, 561 pages, Part7.
File downloaded from PAIR for U.S. Appl. No. 12/328,798, filed Dec. 5, 2008, file through Jun. 8, 2012, 447 pages, Part8.
File downloaded from PAIR for U.S. Appl. No. 12/328,798, filed Dec. 5, 2008, file through Jun. 8, 2012, 561 pages, Part9.
File downloaded from PAIR for U.S. Appl. No. 12/328,798, filed Dec. 5, 2008, 384 pages, Part10.
File downloaded from PAIR for U.S. Appl. No. 12/328,798, filed Dec. 5, 2008, file through Jun. 8, 2012, 189 pages, Part11.
File downloaded from PAIR for U.S. Appl. No. 12/328,798, filed Dec. 5, 2008, file from Jun. 8, 2012 through Jul. 3, 2013, 387 pages.
File downloaded from PAIR for U.S. Appl. No. 13/241,380, filed Sep. 23, 2011, file through Jul. 2, 2012, 242 pages, Part1.
File downloaded from PAIR for U.S. Appl. No. 13/241,380, filed Sep. 23, 2011, file through Jul. 2, 2012, 400 pages, Part2.
File downloaded from PAIR for U.S. Appl. No. 13/241,380, filed Sep. 23, 2011, file through Jul. 2, 2012, 400 pages, Part3.
File downloaded from PAIR for U.S. Appl. No. 13/241,380, filed Sep. 23, 2011, file through Jul. 2, 2012, 400 pages, Part4.
File downloaded from PAIR for U.S. Appl. No. 13/241,380, filed Sep. 23, 2011, file through Jul. 2, 2012, 404 pages, Part5.
File downloaded from PAIR for U.S. Appl. No. 13/241,380, filed Sep. 23, 2011, file through Jul. 2, 2012, 400 pages, Part6.
File downloaded from PAIR for U.S. Appl. No. 13/241,380, filed Sep. 23, 2011, file through Jul. 2, 2012, 400 pages, Part7.
File downloaded from PAIR for U.S. Appl. No. 13/241,380, filed Sep. 23, 2011, file through Jul. 2, 2012, 402 pages, Part8.
File downloaded from PAIR for U.S. Appl. No. 13/241,380, filed Sep. 23, 2011, file through Jul. 2, 2012, 400 pages, Part9.
File downloaded from PAIR for U.S. Appl. No. 13/241,380, filed Sep. 23, 2011, file through Jul. 2, 2012, 400 pages, Part10.
File downloaded from PAIR for U.S. Appl. No. 13/241,380, filed Sep. 23, 2011, file through Jul. 2, 2012, 400 pages, Part11.

(56) References Cited

OTHER PUBLICATIONS

File downloaded from PAIR for U.S. Appl. No. 13/241,380, filed Sep. 23, 2011, file through Jul. 2, 2012, 338 pages, Part12
File downloaded from PAIR for U.S. Appl. No. 13/241,380, filed Sep. 23, 2011, file through Jul. 30, 2012, 34 pages, Part13.
File downloaded from PAIR for U.S. Appl. No. 13/241,380, filed Sep. 23, 2011, file from Jul. 30, 2012 through Jul. 3, 2013, 244 pages.
U.S. Appl. No. 13/350,970, filed Jan. 16, 2012, 47 pages.
Restriction Requirement dated Mar. 19, 2013 for U.S. Appl. No. 13/350,970, filed Jan. 16, 2012, 8 pages.
Response to Restriction Requirement dated Mar. 19, 2013 for U.S. Appl. No. 13/350,970, filed Jan. 16, 2012, 1 page.
Notification of Transmittal of the Int'l Search Report and the Written Opinion of ISR; dated Apr. 24, 2013; for PCT/US2012/068912; 6 pages.
Written Opinion of ISR; dated Apr. 24, 2013; for PCT/US2012/068912; 9 pages.
PCT Search Report & Written Opinion for PCT/US2006/000363 dated May 11, 2006.
Notification, IPER for PCT/US2006/000363 dated Aug. 16, 2007, 10 pages.
Japanese Office Action (full translation) received Jul. 26, 2012; for JP Pat. App. No. 2010-501028; 5 pages.
Letter from Yuasa & Hara; dated Oct. 16, 2012; for JP Pat. App. No. 2010-501028; 2 pages.
Japanese Response to Office Action; received Oct. 16, 2012; for JP Pat. App. No. 2010-501028; 6 pages.
CN Office Action (w/English translation); dated Sep. 10, 2010; for CN Pat. App. No. CN 2008800088956; 14 pages.
PCT Search Report and Written Opinion of the ISA for PCT/US2008/053551; dated Jul. 15, 2008; 11 pages.
PCT International Preliminary Report on Patentability for PCT/US2008/053551; dated Oct. 8, 2009; 7 pages.
PCT Search Report and Written Opinion for PCT/US2009/065044 dated Jan. 7, 2010.
PCT International Preliminary Report on Patentability and Written Opinion of the ISA; dated Jun. 7, 2011; for PCT Pat. App. No. PCT/US2009/065044; 7 pages.
"Gear-Tooth Sensor For Automotive Applications," Allegro Microsystems, Inc., Aug. 3, 2001.
Allegro "Two-Wire True Zero Speed Miniature Differential Peak-Detecting Gear Tooth Sensor;" ATS645LSH; 2004; Allegro MicroSystems, Inc., Worcester, MA 01615; pp. 1-14.
Allegro MicroSystems, Inc., Hall-Effect IC Applications Guide, http://www.allegromicro.com/en/Products/Design/an/an27701.pdf, Copyright 1987, 1997, pp. 1-36.
Alllegro "True Zero-Speed Low-Jitter High Accuracy Gear Tooth Sensor;" ATS625LSG; 2005; Allegro MicroSystems, Inc. Worcester, MA 01615; pp. 1-21.
Bowers et al., "Microfabrication and Process Integration of Powder-Based Permanent Magnets", Interdisciplinary Microsystems Group, Dept. Electrical and Computer Engineering, University of Florida, USA; Technologies for Future Micro-Nano Manufacturing Workshop, Napa, California, Aug. 8-10, 2011, pp. 162-165.
Dwyer, "Back-Biased Packaging Advances (SE, SG & SH versus SA & SB)," http://www.allegromicro.com/en/Products/Design/packaging_advances/index.asp, Copyright 2008, pp. 1-5.
Honeywell International, Inc., "Hall Effect Sensing and Application," Micro Switch Sensing and Control, Chapter 3, http://content.honeywell.com/sensing/prodinfo/solidstate/technical/hallbook.pdf, date unavailable but believed to be before Jan. 2008, pp. 9-18.
Infineon Product Brief, TLE 4941plusC, Differential Hall IC for Wheel Speed Sensing, Oct. 2010, www.infineon.com/sensors, 2 pages.
Johnson et al., "Hybrid Hall Effect Device," Appl. Phys. Lett., vol. 71, No. 7, Aug. 1997, pp. 974-976.
Lagorce et al.; "Magnetic and Mechanical Properties of Micromachined Strontium Ferrite/Polyimide Composites;" Journal of Microelectromechanical Systems; vol. 6, No. 4; Dec. 1997; pp. 307-312.
Lequesne et al.; "High-Accuracy Magnetic Position Encoder Concept;" IEEE Transactions on Industry Applications; vol. 35, No. 3; May/Jun. 1999; pp. 568-576.
Melexis Microelectronic Systems, Hall Applications Guide, Section 3—Applications, 1997 (48 pages).
Oniku et al., "High-Energy-Density Permanent Micromagnets Formed From Heterogeneous Magnetic Powder Mixtures", Interdisciplinary Microsystems Group, Dept. of Electrical and Computer Engineering, University of Florida, Gainesville, FL 32611, USA; Prepring of MEMS 2012 Conf. Paper, 4 pages.
Park et al.; "Ferrite-Based Integrated Planar Inductors and Transformers Fabricated at Low Temperature;" IEEE Transactions on Magnetics; vol. 33, No. 5; Sep. 1997; pp. 3322-3324.
Office Action dated Aug. 4, 2014 for U.S. Appl. No. 12/360,889, filed Jan. 28, 2009, 15 pages.
Notice of Allowance; dated Mar. 1, 2013; for U.S. Appl. No. 12/328,798; 10 pages.
Supplemental Notice of Allowability; dated May 10, 2013; for U.S. Appl. No. 12/328,798; 5 pages.
Notice of Allowance; dated Feb. 21, 2013; for U.S. Appl. No. 13/241,380; 9 pages.
Supplemental Notice of Allowability; dated May 1, 2013; for U.S. Appl. No. 13/241,380; 5 pages.
PCT Invitation to Pay Additional Fees and Partial Search Report of the ISA; dated Jul. 8, 2013; for PCT Pat. App. No. PCT/US2013/025858; 6 pages.
PCT Invitation to Pay Additional Fees and Partial Search Report of the ISA; dated Jul. 1, 2013; for PCT Pat. App. No. PCT/2013/030112; 7 pages.
Japanese Office Action dated Jun. 19, 2014; with English Translation, for Japanese Pat. App. No. 2011-539582; 8 pages.
Japanese Notice Reasons for Rejection (English translation); dated Jul. 16, 2013; for Japanese Pat. App. No. 2011-539582; 3 pages.
International Search Report and Written Opinion dated Jul. 28, 2014 for PCT Application No. PCT/US2014/032125; 18 pages.
Response filed Sep. 23, 2014 to Office Action dated Jul. 17, 2014; for U.S. Appl. No. 13/838,864; 18 pages.
Request for Continued Examination filed Sep. 23, 2014; for U.S. Appl. No. 13/838,864; 2 pages.
Response filed Sep. 23, 2014 to Office Action dated Jul. 17, 2014; for U.S. Appl. No. 13/838,131; 20 pages.
Request for Continued Examination filed Sep. 23, 2014; for U.S. Appl. No. 13/838,131; 2 pages.
Notification, Search Report and Written Opinion dated Sep. 3, 2013 for PCT Application No. PCT/US2013/030112, filed Mar. 11, 2013, 29 pages.
Notification, Search Report and Written Opinion dated Sep. 25, 2013 for PCT Application No. PCT/US2013/025858, filed Feb. 13, 2013, 37 pages.
Response to Office Action; filed Sep. 30, 2013; to Office Action dated Jun. 28, 2013; for U.S. Appl. No. 12/360,889; 15 pages.
International Preliminary Report on Patentability dated Oct. 2, 2014 for PCT Application PCT/2013/025858; 30 pages.
Office Action dated Oct. 6, 2014; for U.S. Appl. No. 13/838,864; 26 pages.
Office Action dated Oct. 2, 2014; for U.S. Appl. No. 13/838,131; 29 pages.
Office Action dated Jan. 28, 2014, for U.S. Appl. No. 13/838,864; 35 pages.
Chinese Office Action from Chinese Patent Application No. 201110285150.8, including English translation, 15 pages.
Reponse to Chinese Office Action filed on Dec. 16, 2013 from Chinese Patent Application No. 201110285150.8, including Applicant's instruction letter to foreign associate, foreign associate emailed response and foreign associate cover letter attached to filed response, 11 pages.
Office Action dated Jan. 9, 2014; for U.S. Appl. No. 838,131; 35 pages.
U.S. Appl. No. 14/090,037 Response to Office Action filed Dec. 16, 2014.
Claims as sent to Yuasa and Hara on Oct. 21, 2014; for Japanese Pat. App. No. 2011-539582; 9 pages.

(56) References Cited

OTHER PUBLICATIONS

Claims as filed on Oct. 28, 2014 by Yuasa and Hara, for Japanese Pat. App. No. 2011-539582; 5 pages.
Request for Continued Examnination filed May 26, 2015; for U.S. Appl. No. 14/090,037; 1 page.
Response to Final Office Action filed May 26, 2015; to Final Office Action dated Feb. 24, 2015; for U.S. Appl. No. 14/090,037; 12 pages.
Office Action dated Mar. 24, 2015 for U.S. Appl. No. 13/838,864; 14 pages.
Office Action dated May 7, 2015 for U.S. Appl. No. 13/424,618; 29 pages.
Response to Written Opinion filed May 1, 2015 for European Application No. 13710112.7; 18 pages.
Response to Written Opinion filed May 11, 2015 for European Application No. 13712040,8; 21 pages.
Office Action dated Apr. 2, 2015 for U.S. Appl. No. 13/838,131; 14 pages.
Letter to Yuasa and Hara dated Jun. 11, 2016; for Japanese Pat. App. No. 2011-539582; 7 pages.
Letter from Yuasa and Hare dated Jun. 19, 2015; for Japanese Pat. App. No. 2011-539582: 1 page.
Japanese Argument and Amendment (including Claims in English) filed Jun. 16, 2015; for Japanese Pat. Appl. No. 2011-539582; 10 pages.
U.S. Appl. No. 14/090,037 Office Action dated Jun. 4, 2015, 5 pages.
Response to Office Action flied Jul. 15, 2015 U.S. Appl. No. 13/424,618; 14 pages.
Response to Office Action filed Jul. 15, 2015 U.S. Appl. No. 13/749,776; 21 pages.
Response to Office Action filed Jul. 15, 2015 U.S. Appl. No. 13/788,210; 9 pages.
Japanese Notice for Reasons of Rejection dated Jul. 30, 2015; for Japanese Pat. App. No. 2014-219004; 4 Pages.
Response to Office Action filed Sep. 3, 2015 for U.S. Appl. No. 14/090,037; 13 pages.
Letter from Yuasa and Hara dated Nov. 9, 2015; For Japanese Pat. App. No. 2011-539582; 1 page.
Response with English Claims dated Oct. 7, 2015 to Office Action; For Japanese Pat. App. No. 2011-539582; 10 pages.
Letter from Yuasa and Hara dated Nov. 10, 2015; For Japanese Pat. App. No. 2011-539582; 1 page.
Japanese Notice of Allowance with English Allowed Claims dated Nov. 4, 2015; For Japanese Pat. App. No. 2011-539582; 8 pages.
Letter from Yuasa and Hara dated Nov. 9, 2015; For Japanese Pat. App. No. 2014-219004; 1 page.
Response with English Claims dated Oct. 29, 2015 to Office Action; For Japanese Pat. App. No. 2014-219004; 10 pages.
Letter from Yuasa and Hara dated Nov. 9, 2015; For Japanese Pat. App. No. 2014-219011; 1 page.
Response with English Claims dated Oct. 29, 2015 to Office Action; For Japanese Pat. App. No. 2014-219011; 9 pages.
Office Action dated Nov. 5, 2015 for U.S. Appl. No. 13/424,618; 24 pages.
International Preliminary Report on Patentability dated Nov. 6, 2015 for PCT Application No. PCT/US2014/032125; 15 pages.
Office Action with English translation dated Jul. 30, 2015 for Japanese Application No. 2014-219004; 7 pages.
Office Action with English translation dated Jul. 30, 2015 for Japanese Application No. 2014-219011; 10 pages.
Final Office Action dated Aug. 21, 2015 for U.S. Appl. No. 13/749,776; 30 pages.
Restriction Requirement dated Aug. 24, 2015 for U.S. Appl. No. 13/748,999; 13 pages.
Office Action with English translation dated Sep. 1, 2015 for Japanese Application No. 2011-539582, 4 pages.
Request for Continued Examination, Response to Office Action, IDS filed Sep. 17, 2015 for U.S. Appl. No. 13/838,131; 17 pages.
Office Action dated Dec. 24, 2015 for U.S. Appl. No. 13/749,776; 30 pages.
Office Action dated Jan. 6, 2016 for U.S. Appl. No. 13/788,210; 15 pages.
Office Action dated Dec. 6, 2000 for U.S. Appl. No. 09/264,254; 12 pages.
Response to Office Action filed Feb. 27, 2001 for U.S. Appl. No. 09/264,254; 11 pages.
Supplemental Amendment filed Mar. 15, 2001 for U.S. Appl. No. 09/264,254; 4 pages.
Preliminary Amendment filed Apr. 19, 2001 for U.S. Appl. No. 09/837,991; 8 pages.
Office Action dated Dec. 19, 2002 for U.S. Appl. No. 09/837,991; 10 pages.
Response to Office Action filed Mar. 4, 2002 for U.S. Appl. No. 09/837,991; 14 pages.
Office Action dated May 14, 2003 for U.S. Appl. No. 09/837,991; 10 pages.
Amendment Under 37 C.F.R § 1.116 dated Sep. 4, 2003 for U.S. Appl. No. 09/837,991; 13 pages.
Request for Continued Examination, Response to Office Action, IDS for U.S. Appl. No. 13/424,618, 25 pages.
Letter from Yuase and Hare dated Feb. 8, 2016; For Japanese Pat. No. 2011-539582; 2 pages.
Japanese Office Action with English translation dated Jan. 27, 2016 for Japanese Patent Application No. 2015-501676; 8 pages.
Response to Office Action dated Mar. 2, 2016 for U.S. Appl. No. 13/838,131; 12 pages.
Response to Office Action dated Mar. 2, 2016 for U.S. Appl. No. 13/788,210; 10 pages.
Response to Office Action dated Mar. 3, 2016 for U.S. Appl. No. 13/749,776; 17 pages.
U.S. Appl. No. 15/049,732, filed Feb. 22, 2016, Milano et al.
Office Action dated Aug. 12, 2015 for U.S. Appl. No. 13/788,210; 17 pages.
Japanese Office Action with English translation dated Nov. 18, 2015; For Japanese Pat. App. No. 2014-219011; 4 pages.
Japanese Final Office Action with English translation dated Nov. 17, 2015; For Japanese Pat. App. No. 2014-219004; 4 pages.
Office Action dated Dec. 2, 2015; For U.S. Appl. No. 13/838,131; 24 pages.
Notice of Allowance dated Nov. 20, 2015; For U.S. Appl. No. 14/090,037; 7 pages.
Request for Continued Examination, Response to Office Action, IDS filed Dec. 1, 2015 for U.S. Appl. No. 13/788,210; 18 pages.
Request for Continued Examination, Response to Office Action, IDS filed Dec. 7, 2015 for U.S. Appl. No. 13/749,776, 24 pages.
Office Action dated Mar. 11, 2016 for U.S. Appl. No. 13/748,999, 35 pages.
Chinese Office Action dated Jan. 29, 2016 with English translation for Chinese Application No. 201380014780.9; 17 pages.
Office Action dated Apr. 1, 2016 for U.S. Appl. 13/749,776; 34 pages.
German Office Action with English translation dated Mar. 3, 2016 for German Patent Application No. 112008000759.4; 10 pages.
Letter to Yuasa and Hara dated Mar. 15, 2016 for Japanese Application No. 2015-501676; 2 pages.
Final Office Action dated Apr. 22, 2016; For U.S. Appl. No. 13/838,131; 27 pages.
Final Office Action dated Apr. 27, 2016 for U.S. Appl. No. 13/788,210, 18 pages.
Chinese Office Action and English translation dated Mar. 2, 2016 for Chinese Application No. 201380026117.0; 50 pages.
Office Action dated May 6, 2016 for U.S. Appl. No. 13/424,618, 15 pages.

* cited by examiner

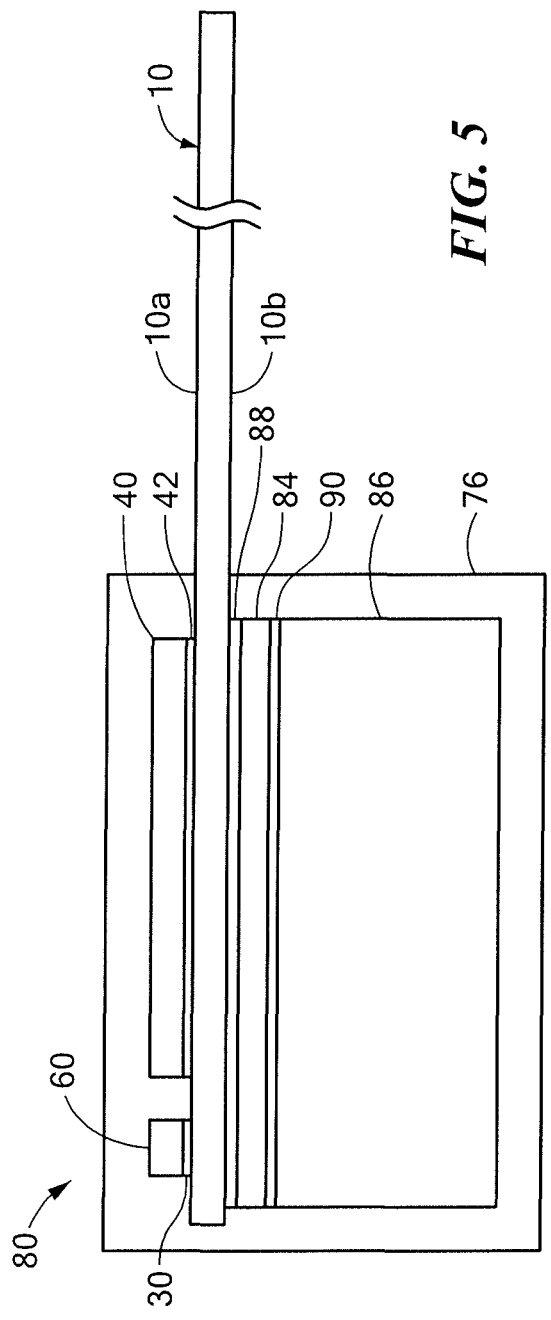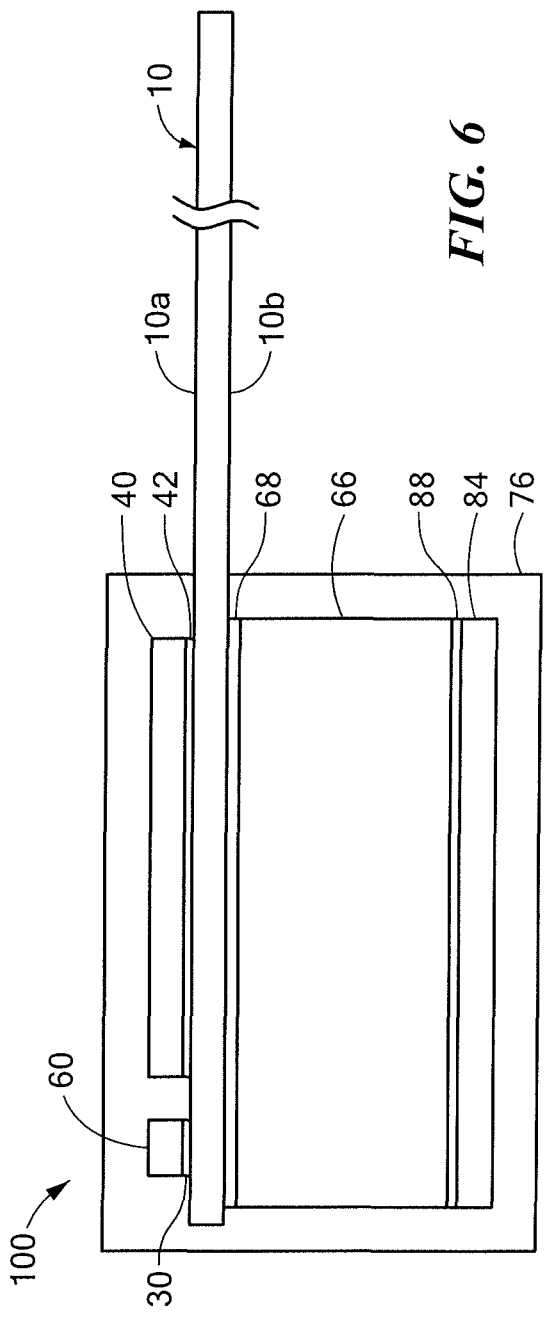

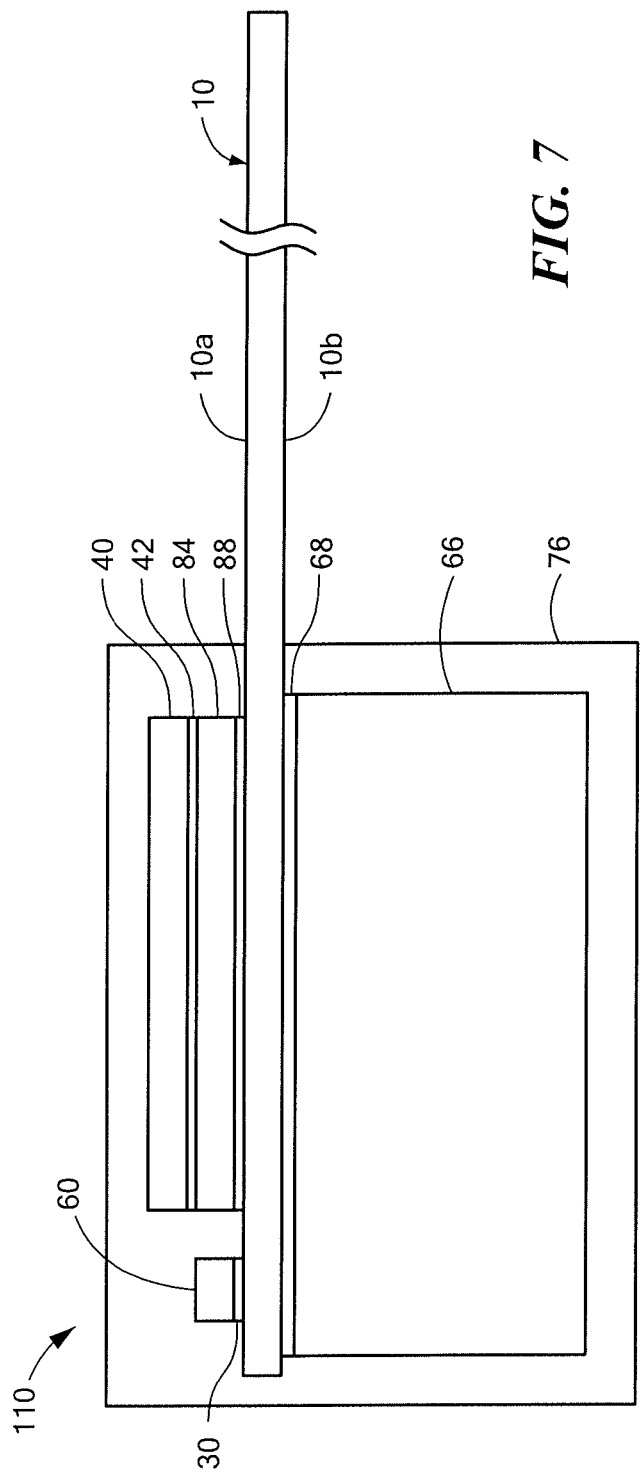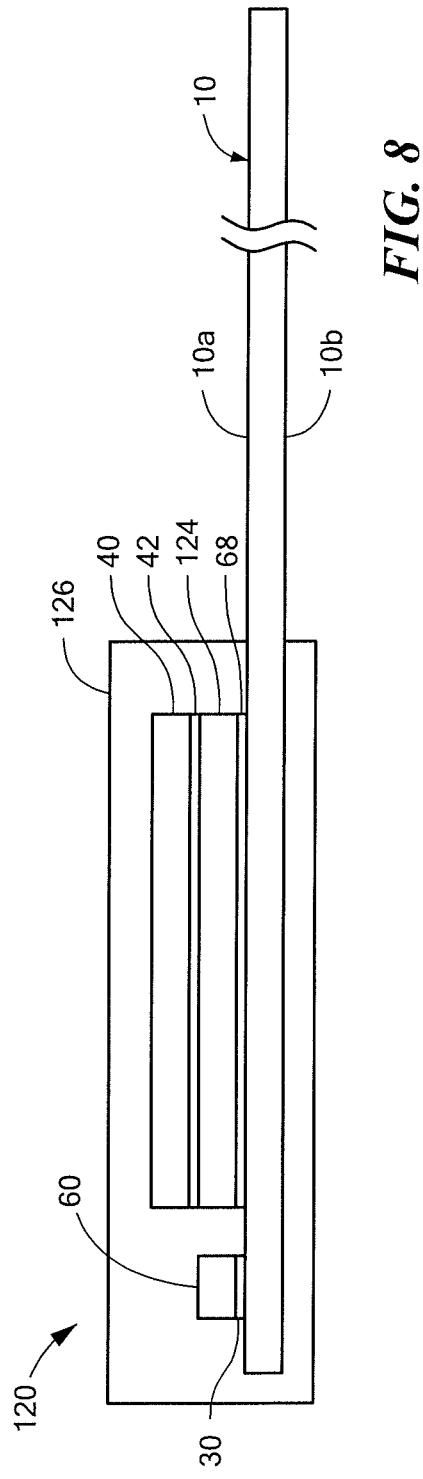

INTEGRATED CIRCUIT PACKAGE HAVING A SPLIT LEAD FRAME AND A MAGNET

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to integrated circuit packaging and, more particularly, to an integrated circuit package having a split lead frame and a magnet.

BACKGROUND OF THE INVENTION

Techniques for semiconductor packaging are well known in the art. In general, a semiconductor die is cut from a wafer, processed, and attached to a die attach pad of a lead frame. The subassembly may then be overmolded with a plastic or other insulative and protective material to form an integrated circuit (IC) package.

After packaging, the IC may then be placed on a circuit board with other components, including passive components such as capacitors, resistors, and inductors, which can be used for filtering and other functionality. For example, in the case of a magnetic field sensor integrated circuit containing a magnetic field sensing element, components such as capacitors are often required to reduce noise and enhance EMC (electromagnetic compatibility).

Magnetic field sensors including a magnetic field sensing element, or transducer, such as a Hall Effect element or a magnetoresistive element, are used in a variety of applications to detect aspects of movement of a ferromagnetic article, or target, such as proximity, speed, and direction. Illustrative applications include, but are not limited to, a magnetic switch or "proximity detector" that senses the proximity of a ferromagnetic article, a proximity detector that senses passing ferromagnetic articles (for example, magnetic domains of a ring magnet or gear teeth), a magnetic field sensor that senses a magnetic field density of a magnetic field, and a current sensor that senses a magnetic field generated by a current flowing in a current conductor. Magnetic field sensors are widely used in automobile control systems, for example, to detect ignition timing from a position of an engine crankshaft and/or camshaft, and to detect a position and/or rotation of an automobile wheel for anti-lock braking systems.

In applications in which the ferromagnetic target is magnetic or of a hard ferromagnetic material, a magnetically permeable concentrator or magnetic flux guide is sometimes used to focus the magnetic field generated by the target on the magnetic field transducer, thus increasing the sensitivity of the sensor, allowing the use of a smaller magnetic target, and/or allowing the magnetic target to be sensed from a larger distance (i.e., a larger airgap). In other applications, in which the ferromagnetic target is not magnetic, a permanent magnet, sometimes referred to as a back bias magnet, may be used to generate the magnetic field that is then altered by movement of the target.

In some applications it is desirable to provide a back bias magnet with two magnetic poles on the magnet surface adjacent to the magnetic field transducer. For example, as described in a U.S. Pat. No. 5,781,005 entitled "Hall-Effect Ferromagnetic-Article-Proximity Sensor," which is assigned to the Assignee of the subject application, the near presence of opposite poles serves to short out the lines of flux when no ferromagnetic article is present, thereby presenting a significant and easily recognizable difference between an article present (e.g., gear tooth present) condition and an article absent (e.g., gear valley present) condition and maintaining a low magnetic flux density baseline regardless of airgap. Because of the easily recognizable difference in the magnetic field signal, these types of arrangements are advantageous for use in sensors in which it is necessary to detect the presence/absence of a magnetic article, such sensors sometimes being referred to as True Power On Sensors, or TPOS sensors.

Generally, back bias magnets and concentrators are held in place relative to the magnetic field sensing element by mechanical means, such as an adhesive as shown in a U.S. Pat. No. 6,265,865 entitled "Single Unitary Plastic Package for a Magnetic Field Sensing Device," which is assigned to the Assignee of the subject application. Other sensors are manufactured so that the sensor and the back bias magnet or concentrator are integrally formed. A magnetic field sensor of this type is described in a U.S. Patent Application Publication No. 2010/0141249 entitled "Magnetic Field Sensors and Methods for Fabricating the Magnetic Field Sensors," which is also assigned to the Assignee of the subject application and in which a concentrator or magnet may be formed by a liquid encapsulant or a combination of a liquid encapsulant and permanent magnet in a cavity on the side of the sensor opposite the target.

There are many package types and fabrication techniques in use for providing integrated circuit magnetic field sensors. For example, the semiconductor die in which the magnetic field sensing element is formed may be attached to a lead frame by various techniques, such as with an adhesive tape or epoxy, and may be electrically coupled to the lead frame by various techniques, such as with solder bumps or wire bonding. Also, the lead frame may take various forms and the semiconductor die may be attached to the lead frame in an orientation with the active semiconductor surface (i.e., the surface in which the magnetic field sensing element is formed) being adjacent to the lead frame in a so called "flip-chip" arrangement, with the active semiconductor surface opposite the lead frame surface in a so called "die up" arrangement, or with the semiconductor die positioned below the lead frame in a so called "lead on chip" arrangement.

Molding is often used in fabricating integrated circuit magnetic field sensors to provide the protective and electrically insulative overmold to the semiconductor die. Transfer molding has also been used to form two different molded portions for various reasons. For example, in a U.S. Pat. No. 7,816,772 entitled "Methods and Apparatus for Multi-Stage Molding of Integrated Circuit Package" which is assigned to the Assignee of the subject application, a first molded structure is formed over the semiconductor die to protect wire bonds and the device is overmolded with a second molded structure formed over the first molded structure. In a U.S. Patent Application Publication No. 2009/0140725 entitled "Integrated Circuit Including Sensor having Injection Molded Magnetic Material," an injection molded magnetic material encloses at least a portion of a magnetic field sensor.

SUMMARY OF THE INVENTION

A magnetic field sensor includes a lead frame having a first surface, a second opposing surface, and a plurality of leads, wherein at least two of the leads have a connection portion and a die attach portion. A semiconductor die supporting a magnetic field sensing element is attached to the die attach portion of the at least two leads adjacent to the first surface of the lead frame and a separately formed ferromagnetic element is disposed adjacent to the lead frame. The ferromagnetic element may be a sintered element or a molded element.

In some embodiments, the ferromagnetic element is attached adjacent to the second surface of the lead frame and in other embodiments, the ferromagnetic element is attached adjacent to the first surface of the lead frame between the lead frame and the semiconductor die. An attachment mechanism is provided to attach the ferromagnetic element to the lead frame. Illustrative attachment mechanisms include one or more of a non-conductive adhesive, epoxy, tape, film or spray.

The ferromagnetic element may be comprised of a hard ferromagnetic material to form a permanent magnet or a soft ferromagnetic material to form a concentrator. A second ferromagnetic element comprising a soft or hard ferromagnetic material may also be provided.

A non-conductive mold material encloses the semiconductor die and the die attach portion of the at least two leads and in some embodiments, the sensor further includes a passive component coupled to at least two of the leads. The passive component may take various forms, such as a capacitor, resistor, inductor, Transient Voltage Suppressor (TVS), diode (including, but not limited to Zener diode). The passive component may be coupled to the die attach portion of the at least two leads and/or may be coupled to the connection portion of the at least two leads.

In some embodiments, the die attach portion of at least one of the leads has a first portion that is separated from a second portion and the magnetic field sensor further includes a passive component, such as a resistor, coupled between the first portion and second portion of the die attach portion.

Also described is a magnetic field sensor including a lead frame having a first surface, a second opposing surface, and a plurality of leads, wherein at least two of the leads have a connection portion and a die attach portion. A magnet is attached to the die attach portion of the at least two leads adjacent to the first surface of the lead frame and a semiconductor die supporting a magnetic field sensing element is attached to the magnet.

BRIEF DESCRIPTION OF THE DRAWINGS

The foregoing features of the invention, as well as the invention itself may be more fully understood from the following detailed description of the drawings, in which:

FIG. 5 is cross-sectional side view of an alternative magnetic field sensor integrated circuit including a concentrator between the magnet and the lead frame;

FIG. 6 is cross-sectional side view of another alternative magnetic field sensor integrated circuit including a concentrator attached to a surface of the magnet distal from the lead frame;

FIG. 7 is cross-sectional side view of an alternative magnetic field sensor integrated circuit including a concentrator between the lead frame and the die;

FIG. 8 is cross-sectional side view of yet another magnetic field sensor integrated circuit including a magnet between the lead frame and the die;

DETAILED DESCRIPTION OF THE INVENTION

Figure 1:
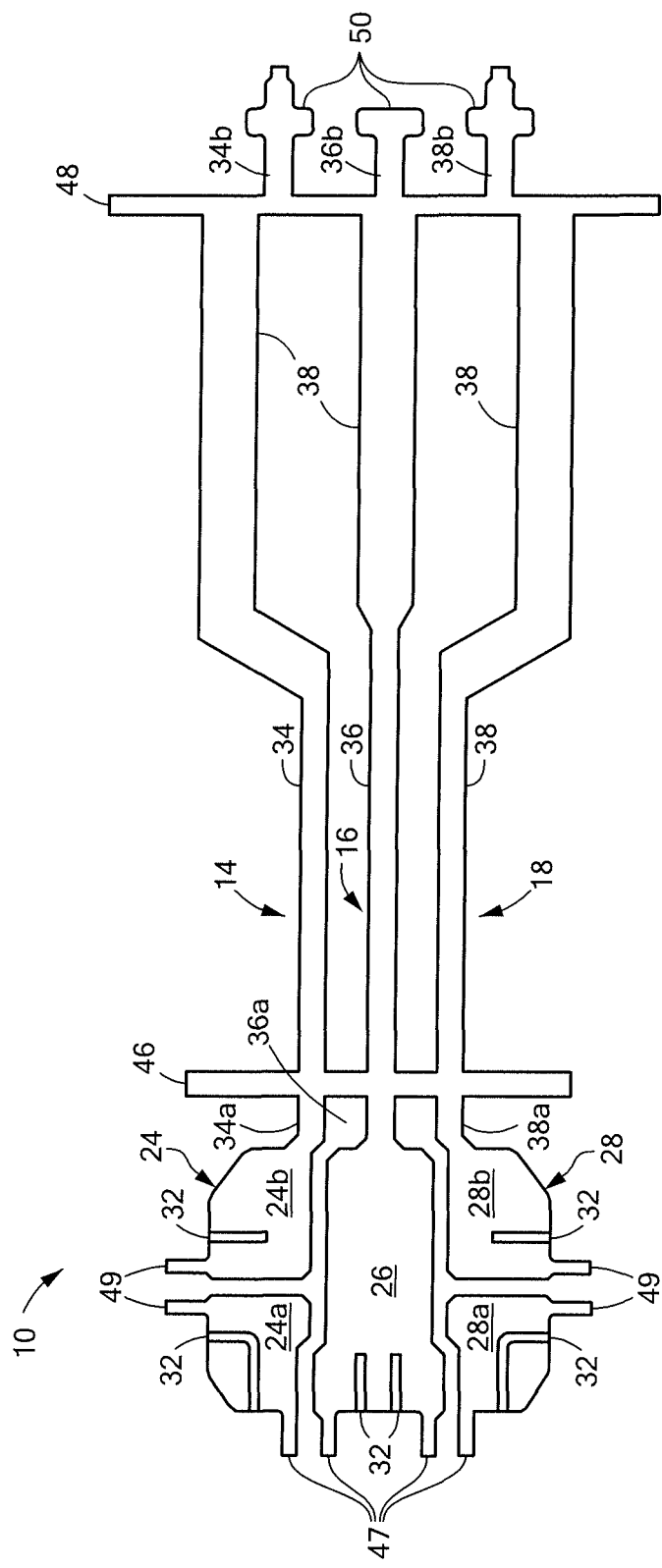
FIG. 1 is a plan view of a split lead frame.
Figure 2:
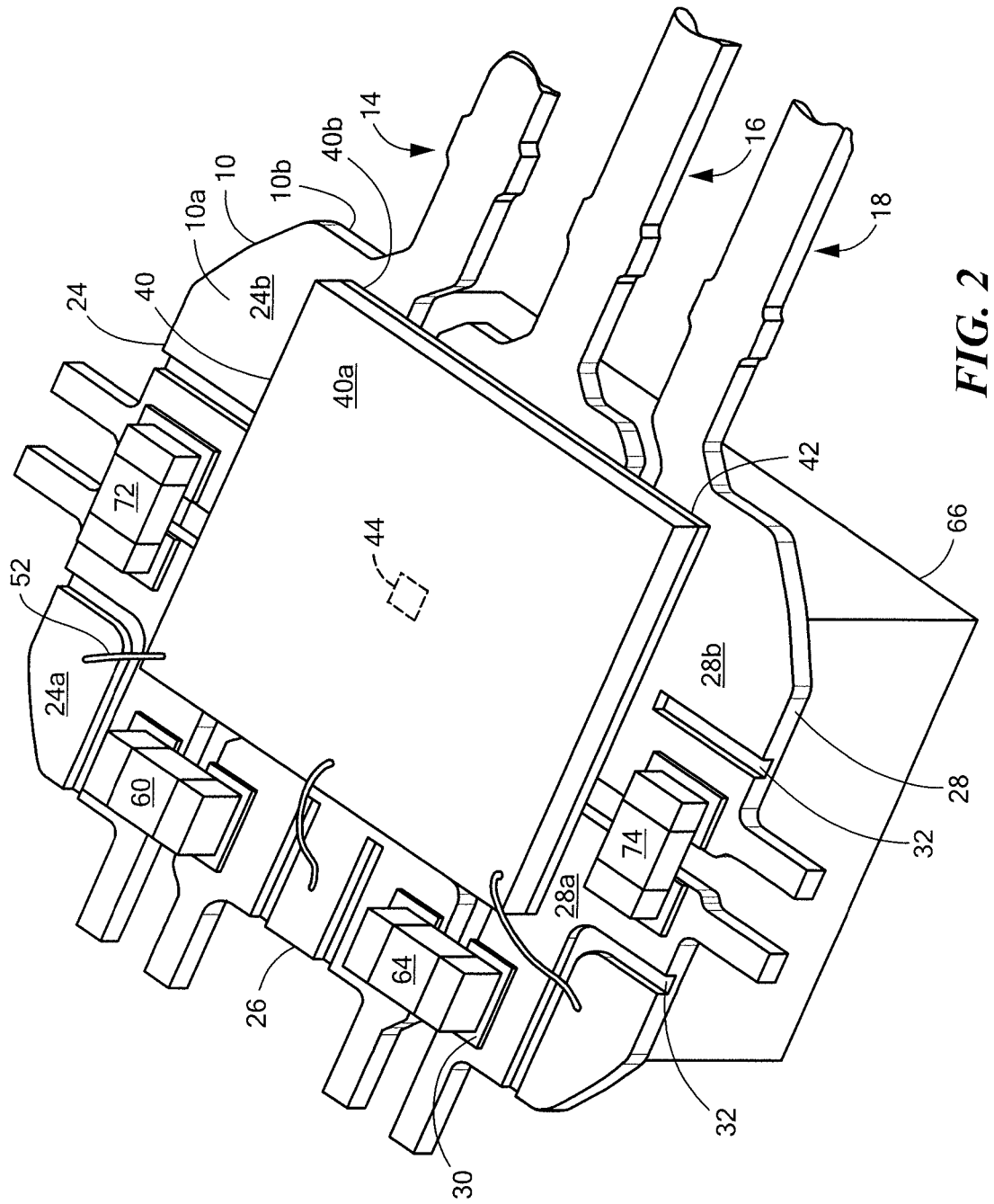
FIG. 2 is a perspective view of a magnetic field sensor integrated circuit subassembly containing the split lead frame of FIG. 1 and including a magnet.

Referring to FIG. 1, a lead frame 10 for use in an integrated circuit includes a plurality of leads 14, 16, 18 at least two of which (and here, all three) include a respective die attach portion 24, 26, 28 and connection portion 34, 36, 38. The lead frame 10 has a first surface 10*a* and a second, opposing surface 10*b* (FIG. 2). As will be explained, the die attach portion 24, 26, 28 of the leads (referred to herein sometimes as simply the die portion) can have a semiconductor die 40 (FIG. 2) attached thereto. While the lead frame 10 is shown to include three leads 14, 16, 18, it will be appreciated by those of ordinary skill in the art that various numbers of leads, such as between two and eight, are possible.

The connection portion 34, 36, 38 of the leads extends from a first end 34*a*, 36*a*, 38*a* proximate to the respective die portion 24, 26, 28 to a second, distal end 34*b*, 36*b*, 38*b* distal from the die portion. Generally, the connection portion 34, 36, 38 of the leads is elongated and is suitable for making electrical connection to electronic systems and components (not shown) outside of the integrated circuit package, such as a power source or microcontroller. For example, in the case of a through hole connection to a printed circuit board, the distal end 34*b*, 36*b*, 38*b* of the connection portions is provided in form of a pin suitable for a solder connection to a circuit board through hole. Alternatively, in the case of a surface mount connection, the distal end 34*b*, 36*b*, 38*b* of the connection portions will include a surface mount pad. Another embodiment may include a wire soldered or otherwise connected to the connection portions 34, 36, 38.

The lead frame 10 has tie bars 46, 47, 48, 49 that are provided to hold the leads 14, 16, 18 together during manufacture. A first tie bar 46 is positioned near the die portion 24, 26, 28 of the leads and the first end 34*a*, 36*a*, 38*a* of the connection portions and a second tie bar 48 is positioned near the distal end 34*b*, 36*b*, 38*b* of the connection portions 34, 36, 38 as shown. Another tie bar portion is shown at 47 at the opposite side of the die portion 24, 26, 28 from the lead ends 34*a*, 36*a*, 38*a*. Another tie bar portion is shown at 49 on the outer side of the die portions 24, 28. In addition to facilitating manufacture, the tie bar(s) can also serve to protect the leads during handling, for example, by maintaining coplanarity of the elongated connection portions 34, 36, 38.

An additional feature of the lead frame 10 includes extended regions 50 that extend beyond the distal ends 34*b*, 36*b*, 38*b* of the lead connection portions, as shown. These regions 50 may be molded with plastic (FIG. 4) to help maintain lead co-planarity with electrical isolation after the tie bars have been cut or the package has been singulated to form the lead frame during manufacturing. The regions 50 if molded from a sufficiently non-conductive material allow the lead planarity to be maintained during electrical testing for example.

The connection portion 34, 36, 38 of the leads 14, 16, 18 may have widened regions 38 in order to further facilitate handling of the integrated circuit during assembly and improve the strength of the leads. The illustrative widened regions 38 extend slightly outward along a portion of the length of the connection portions, as shown. It will be appreciated that the widened regions may have various shapes and dimensions to facilitate IC integrity during handling and assembly, or be eliminated in other embodiments, and may extend in a direction toward the adjacent lead(s) as long as the desired spacing between leads is achieved.

The lead frame 10 may be formed from various materials and by various techniques, such as stamping or etching. As one example, the lead frame 10 is a copper lead frame preplated with NiPdAu. Other suitable materials for the lead frame include but are not limited to aluminum, copper, copper alloys, titanium, tungsten, chromium, Kovar™, nickel, or alloys of the metals. Furthermore, the lead frame 10 may be comprised of a non-conductive substrate material, such as a standard PC board with FR-4 and copper traces, or a Kapton material with copper or other metal traces (for example a flexible circuit board).

The lead and lead frame dimensions can be readily varied to suit particular application requirements. In one illustrative example, the leads 14, 16, 18 have a thickness on the order of 0.25 mm and the connection portions 34, 36, 38 are on the order of 16 to 18 mm long. In other embodiments the thickness of the material may be less or more than 0.25 mm, for example a range of 0.1 mm to 0.5 mm. The length of the leads may also be longer or shorter than described above for example on the order of 10 mm to 25 mm. Typically, the lead frame 10 which will be used to form a single integrated circuit, is formed (e.g., stamped) with a plurality of other identical or similar lead frames in a single stamping process for example, and the lead frames 10 separated during manufacture for formation of individual integrated circuits. The lead frame 10 may be flexible or rigid, depending on the material, dimensions, and requirements.

According to an "in-line" passive component feature described further below in conjunction with FIG. 2, the die attach portion of one or more of the leads (here, illustrative die attach portions 24 and 28 of respective leads 14, 18) includes at least two separate portions, which, in assembly, are coupled together through one or more passive components. For example, die attach portion 24 includes two separate portions 24a and 24b, each of which has an end that is spaced from and proximate to the end of the other lead portion. Similarly, die attach portion 28 includes two separate portions 28a and 28b, each of which has an end that is spaced from and proximate to the end of the other lead portion.

The die attach portion of one or more of the leads further may further include at least one separating feature, here labeled 32, that serves to separate areas of a die attach portion from each other. More particularly, and as will be described, a passive component may be soldered to various areas of the die attach portions, wire bond connections may be made to areas of the die attach portions, a die may be attached to the die attach portion, and a ferromagnetic element may be attached to the die attach portions, as examples. The separating features 32 are provided in order to prevent solder used to attach any of these elements from adversely impacting (e.g., by solder or flux flowing to adjacent areas) adjacent solder or other connections to other elements. For example, separating features 32 prevent solder used to attach a passive component to a die attach area from adversely impacting adjacent wire bond connection regions. If the die were electrically attached to the lead frame through a flip-chip or other solder process the separating features 32 would prevent the solder or attach material (maybe a conductive epoxy in some embodiments) from adversely impacting other attachment areas of the lead frame. The separating features 32 may take various forms. As examples, the separating features 32 may be recessed or raised areas. The illustrative separating features 32 are recessed areas, such as may be formed by etching, partial etching, coining, or stamping.

The lead frame 10 and more particularly one or more of the die attach portions 24, 26, 28 may contain one or more slots (not shown). As is well known, in the presence of a changing, AC or transient magnetic field (e.g., a magnetic field surrounding a current carrying conductor), eddy currents can be induced in a conductive lead frame. Slots can move the position of the eddy currents and also reduce a size (e.g., a diameter or path length) of the closed loops in which the eddy currents travel in the lead frame to result in a smaller magnetic field error so that a Hall effect element experiences a smaller magnetic field from the eddy currents than it would otherwise experience, resulting in less error in the measured field and enhanced overall performance of the sensor. Details of a slotted lead frame may be found in U.S. Patent Application Publication No. US-2012-0086090-A1 for example, which application is assigned to the Assignee of the subject invention and incorporated herein by reference in its entirety.

Referring also to FIG. 2, at a later stage of manufacture, a semiconductor die 40 can be attached to the lead frame 10. The lead frame 10 does not have a conventional contiguous die attach pad or area to which the die is attached, but rather the die is attached to die portions 24, 26, 28 of at least two leads 14, 16, 18 and thus to a non-contiguous surface. Accordingly, the lead frame 10 can be referred to as a "split lead frame" since there is not a contiguous die attach surface. The semiconductor die 40 has a first surface 40a in which a magnetic field sensing element 44 is disposed and a second, opposing surface 40b. The die 40 may be attached to the die attach portion 24, 26, 28 of the leads such that the opposing die surface 40b is adjacent to the die attach portions 24, 26, 28 in a die up arrangement. Alternatively, the semiconductor die 40 may be attached to the die attach portion 24, 26, 28 of the leads such that the first, active die surface 40a is adjacent to the die attach portions 24, 26, 28 in a flip-chip arrangement. The die could alternatively be attached to the lead frame in a lead on chip arrangement. It will be appreciated that while the die 40 is shown to be attached to all three of the die attach portions 24, 26, 28, the die may alternatively be attached to only two such die attach portions.

Various techniques and materials can be used to attach the die 40 to the die attach portions 24, 26, 28. Since the die 40 is attached across multiple leads 14, 16, 18, the mechanism 42 for attaching the die to the lead frame 10 is non-conductive adhesive and may take various forms, such as a non-conductive, electrically insulative adhesive, such as a thermoset adhesive (e.g., a two part epoxy), epoxy, tape, such as a Kapton® tape, or die attach film.

In addition to the magnetic field sensing element 44, the die 40 supports other electronic components and circuitry, and the sensing element 44 and other electronic components supported by the die can be coupled to the leads 14, 16, 18 by various techniques, such as by solder balls, solder bumps, pillar bumps, or the illustrated wire bonds 52. If solder balls, solder bumps, or pillar bumps are used, the die 40 may be attached to the die attach portions 24, 26, 28 with the active die surface 40a (in which the magnetic field sensing element 44 is disposed) adjacent to the lead frame surface 10a, as in a flip-chip arrangement.

In the illustrative embodiment of FIG. 2, the wire bonds 52 are coupled between the die 40 and a location of the die attach portions 24, 26, 28 distal from the respective connection portion 34, 36, 38. It will be appreciated however that the wire bonds 52 may alternatively or additionally be coupled between the die 40 and a location of the die attach portions 24, 26, 28 proximal from the respective connection portion 34, 36, 38. The die surface 40a may also be adjacent to 10b when attached in a "lead-on-chip" type of arrangement.

While the illustrated die 40 is used to form a magnetic field sensor and thus, supports at least one magnetic field sensing element 44, it will be appreciated by those of ordinary skill in the art that the integrated circuit packaging described herein can be used in connection with other types of integrated circuits. As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR, including spin-valve structures) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of maximum sensitivity perpendicular to a substrate, while metal based or metallic magnetoresistance elements (e.g., GMR, TMR, AMR) and vertical Hall elements tend to have axes of maximum sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

The integrated circuit shown during manufacture in FIG. 2 may include at least one integrated passive component, such as a resistor, inductor, capacitor, Transient Voltage Suppressor (TVS), diode (including, but not limited to Zener diode), and here includes two capacitors 60, 64, attached to the lead frame 10 as may be desirable for filtering and/or other functionality. More particularly, each capacitor 60, 64 is coupled across the die attach portion of two of the leads 24, 26, 28. The capacitors 60, 64 may be useful to reduce EMC, ESD or address other electrical issues with the resulting sensor. For example, with capacitors 60, 64 power to the sensor may be held longer in order to prevent a power on reset state by holding an output state in the case of a broken or damaged wire. It is possible to have other types of passive components coupled between different leads and/or between the same leads in parallel. For example, one capacitor may be coupled between a power lead and a ground lead and another capacitor may be coupled between an output lead and a ground lead. While two capacitors are shown in FIG. 2, it will be appreciated that any number of capacitors or other passive components may be used as desirable for a particular application.

Various techniques and materials are suitable for attaching a passive component to the leads 14, 16, 18. As one example, the capacitors 60, 64 are surface mount capacitors and the die attach portions 24, 26, 28 include respective surface mount pads, plated areas, or solder paste regions (referred to generally as passive attachment mechanism 30) to which each capacitor is attached, as shown. For example, the passive components 60, 64 can be attached to the die attach portions 24, 26, 28 by soldering or with a conductive adhesive, such as a conductive epoxy.

In some embodiments, the leads may have a cutout, depressed, or recessed region in which a passive component, such as capacitor 60, can be positioned below the surface 10a of the lead frame on which the die 40 is positioned. With such an arrangement, the "active area depth" of the sensor (the distance from the sensing element to the outside edge of the package nearest the object or magnetic field source to be sensed, in some embodiments this may be above the sensing element) and the entire package thickness is advantageously reduced as compared to a package having a capacitor mounted on the lead frame surface 10a. In another embodiment the passive component(s) may be attached to the opposite surface 10b of the lead frame. Such an arrangement may allow further reduction of the active area depth by reducing the thickness of the mold material above the die. Additional aspects of integrated passive components are described in a U.S. Patent Application Publication No. US-2008-0013298-A1, entitled "Methods and Apparatus for Passive Attachment of Components for Integrated Circuits," which is assigned to the Assignee of the subject application.

In some embodiments, it may be desirable to alternatively or additionally couple one or more passive components across one or more leads at a position along the connection portion 34, 36, 38 of the respective leads (rather than across die attach portions of the leads). In such an embodiment, the lead connection portions 34, 36, 38 may be provided with extended regions extending laterally from the leads at the desired position along the length of the respective lead connection portion. The extended regions facilitate coupling the passive component between respective pairs of leads such as by soldering. Alternatively, the extended regions may be omitted and the passive component(s) may be coupled directly across respective pairs of lead connection portions. Such passive components may be enclosed by a mold material to provide a second mold enclosure. The passive component(s), such as a capacitor, may be fabricated by techniques described in the above-referenced U.S. Patent Application Publication No. US-2012-0086090-A1.

The integrated circuit may further include one or more passive components coupled in series, or "in-line" with at least one lead. To this end, a lead die attach portion 24 for example includes at least two separate portions 24a and 24b and the portions are coupled together through one or more passive components 72. More particularly, each of the lead die attach portions 24a and 24b has an end that is spaced from and proximate to the end of the other lead portion. Passive component 72 is coupled to both the lead portion 24a and to lead portion 24b, thereby being electrically connected in series with the lead. This arrangement can advantageously permit series coupling of passive components with one or more leads.

It will be appreciated that while the die 40 is shown in FIG. 2 to be attached to the full die attach portions 24, 26, and 28 (i.e., to die attach portion 26, to the separated portions 24a, 24b of die attach portion 24 and also to the separated portions 28a, 28b of die attach portion 28), in other embodiments, the die can be attached to one or the other of separated die attach portions 24a, 24b and/or 28a, 28b. As one specific example, in a two lead (sometimes also referred as "two wire") integrated circuit sensor embodiment (where lead 14 is eliminated for example), die 40 may be attached to die attach portions 28a and 26, assuming that lead frame portion 28a and/or die dimensions are altered accordingly.

The passive component 72 may take various forms, such as a capacitor, resistor, inductor, Transient Voltage Suppressor (TVS), diode (including, but not limited to Zener diode) as examples, which component(s) is provided for various purposes, such as to improve EMC performance. In one embodiment, the passive component 72 is a resistor. It will be appreciated that in embodiments in which the passive component 72 is a capacitor, AC voltages can be applied.

The sensor may include more than one in-line passive component which may be the same or different types of passive components. In the illustrated embodiment, a second passive component 74 is coupled across lead die attach portions 28a, 28b, as shown. Furthermore, more than one passive component can be coupled across the same die attach portions, such as portions 28a, 28b, so as to provide more than one passive component coupled in parallel with each other. Also, a single lead die attach portion, such as that formed by lead portions 28a and 28b, can have more than one separation or break and more than one passive component coupled across the respective breaks so as to form an arrangement in which more than one passive component is coupled in series with a respective lead.

In some embodiments, it may be desirable to alternatively or additionally couple one or more passive components in-line with one or more leads at a position along the connection portion 34, 36, 38 of the respective lead (rather than across die attach portions 28a, 28b in the example described above for example). In such an embodiment, the connection portion of a lead will have a break or separation so that there would be two or more portions to the respective connection portion with such portions being coupled together through the in-line passive component. In this embodiment, opposing edges of the separated connection portion(s) 34, 36, 38 may be provided with regions extending laterally from the leads. The extended regions facilitate coupling the passive component between the separated connection portions such as by soldering. Alternatively, the extended regions may be omitted and the passive component(s) may be coupled directly across respective separated lead connection portions. Such passive components may be enclosed by a mold material to provide a further mold enclosure.

The integrated circuit subassembly shown during manufacture in FIG. 2 further includes a separately formed ferromagnetic element 66 adjacent to the lead frame 10. In use, a magnetic field sensor containing the subassembly may be positioned in proximity to a moveable magnetically permeable ferromagnetic article, or target (not shown), such that the magnetic field transducer 44 is adjacent to the article and is thereby exposed to a magnetic field altered by movement of the article. The target may be comprised of a hard ferromagnetic, or simply hard magnetic material (i.e., a permanent magnet such as a segmented ring magnet), a soft ferromagnetic material, or even an electromagnet and sensor embodiments described herein may be used in conjunction with any such target arrangements. The magnetic field transducer 44 generates a magnetic field signal proportional to the magnetic field.

Figure 3:
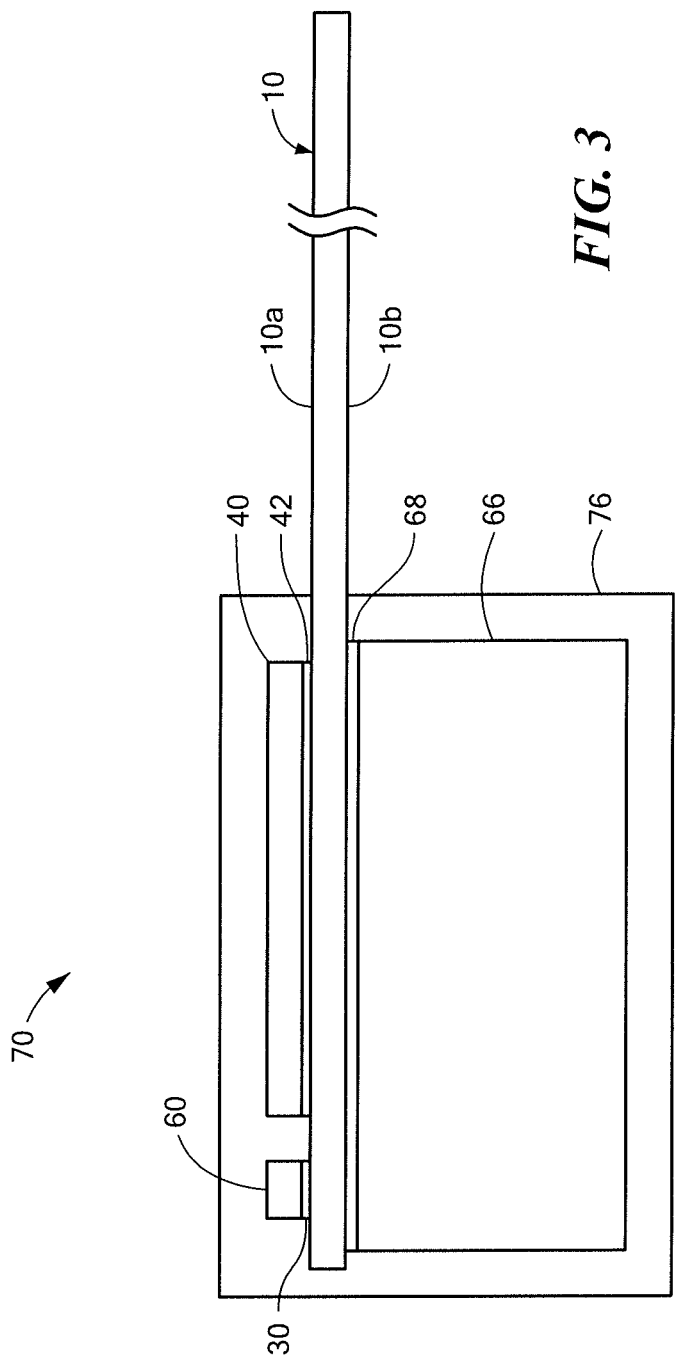
FIG. 3 is a cross-sectional side view of a packaged magnetic field sensor integrated circuit containing the subassembly FIG. 2.

The ferromagnetic element 66 may take various forms selected to enhance the magnetic field sensing capability and/or performance of the sensor based on attributes of the adjacent target, application specifications and requirements and other factors. In the embodiment of FIG. 2, the ferromagnetic element 66 is a magnet (hard ferromagnetic material) attached adjacent to the surface 10b of the lead frame 10 opposite from the die 40 with a ferromagnetic element attachment mechanism 68 (FIG. 3).

Various materials and techniques are suitable for providing the ferromagnetic element attachment mechanism 68 such as a non-conductive, electrically insulative adhesive, such as a thermoset adhesive (e.g., a two part epoxy), epoxy, tape, such as a Kapton® tape, film, or spray. In some cases the tape may have a single sided adhesive layer, while in others a double-sided adhesive tape may be used. Furthermore, the ferromagnetic element attachment mechanism 68 may comprise a combination of materials and layers, such a layer of Kapton® tape adjacent to the lead frame surface 10b spanning multiple die attach portions and a layer of adhesive epoxy between the Kapton® tape and the ferromagnetic element. As another example, the lead frame surface 10b spanning multiple die attach portions may be covered with a dielectric spray to which an adhesive is applied for further attachment of the ferromagnetic element. And as yet another example, the ferromagnetic element 66 may have a non-conductive coating, including but not limited to a dielectric spray, or epoxy on a surface that is then attached to a further adhesive layer such as a two-sided adhesive tape that in turn is secured to the lead frame surface 10b. In another embodiment, a single sided tape may be used with the adhesive side attached to the lead frame surface 10b and then an epoxy used to connect the non-adhesive side of the tape to the magnet 66.

The magnet 66 may be comprised of a hard ferromagnetic or simply hard magnetic material (i.e., a permanent magnet such as a segmented ring magnet) to form a bias magnet. In embodiments in which the magnet 66 forms a bias magnet and in which the sensor is oriented relative to the target such that transducer 44 is closer to the target than the magnet 66, the bias magnet may be referred to as a back bias magnet. This arrangement is well suited for embodiments in which the target is comprised of a soft ferromagnetic material. The magnet may also comprise a hard magnetic material or permanent magnet in embodiments in which the magnetic field sensing element 44 is a magnetoresistance element and a bias field is desired.

Illustrative hard magnetic materials for the magnet 66 include, but are not limited to hard magnetic ferrites, SmCo alloys, NdFeB alloy materials, or Plastiform® materials of Arnold Magnetic Technologies Corp., or other plastic compounds with hard magnetic particles, for example a thermoset polymer such as polyphenylene sulfide material (PPS) or nylon material containing SmCo, NdFeB, or hard ferromagnetic ferrite magnetic particles; or a thermoset polymer such as SUMIKON®EME of Sumitomo Bakelite Co., Ltd or similar type of thermoset mold material containing hard magnetic particles. In some embodiments it may be desirable to align the hard ferromagnetic particles during molding or sintering to form a more anisotropic or directional permanent magnetic material by molding or sintering in the presence of a magnetic field; whereas, in other embodiments, a sufficient magnet may result without an alignment step during molding for isotropic materials. It will be appreciated that a NdFeB or a SmCo alloy may contain other elements to improve temperature performance, magnetic coercivity, or other magnetic properties useful to a magnetic design. In some embodiments, including but not limited to NiFeB magnets, a coating such an electroplated Nickel layer may be applied to the surface of the magnet 66 to prevent or reduce corrosion of the magnet.

The magnet 66 may be formed by sintering or other suitable method, such as compression molding, injection molding, and transfer molding, and potting. It will be appreciated that the magnet 66 may be magnetized in multiple directions, either perpendicular or parallel to the die surface in an x, y, and/or z direction. Other off-axis directions may also be used to magnetize the magnet 66 for specific applications. The magnetic properties for an anisotropic magnet will be optimal when the magnetization direction is aligned with the direction of field applied during manufacturing, but these two directions need not be used in all cases to manufacture a useful device. The magnet 66 may have various shapes and dimensions. For example, the magnet may be provided in the form of a ring-like structure as may be described as having an "O" or "U" shape or a partial ring-like structure as may be described as having a "C" or "U" shape. In embodiments in which the magnet has a non-contiguous central region, the central region may be an open area or may contain a ferromagnetic material or a separately formed element, such as a steel rod for example.

Referring also to FIG. 3, in which like elements are labeled with like reference characters, a cross-sectional side view of packaged integrated circuit magnetic field sensor 70 containing the subassembly of FIG. 2 is shown after overmolding. The sensor includes lead frame 10, die 40 attached to a surface 10a of the lead frame with die attachment mechanism 42, magnet 66 attached to an opposing surface 10b of the lead frame with attachment mechanism 68. Also shown is passive component 60 attached to a surface 10a of the lead frame with passive attachment mechanism 30.

During overmolding, a non-conductive mold material is used to provide an enclosure 76 to enclose the semiconductor die 40 and a portion of the leads 14, 16, 18 including the respective die attach portions 24, 26, 28. The non-conductive molded enclosure 76 may be formed by various techniques, including but not limited to injection molding, compression molding, transfer molding, and/or potting, from various non-conductive mold materials, such as Sumitomo FGT700. In general, the non-conductive mold material 76 is comprised of a non-conductive material so as to electrically isolate and mechanically protect the die 40 and the enclosed portion of the lead frame 10. Suitable materials for the non-conductive mold material 76 include thermoset and thermoplastic mold compounds and other commercially available IC mold compounds. It will be appreciated that the non-conductive mold material 76, while typically non-ferromagnetic, can contain a ferromagnetic material, such as in the form of ferromagnetic particles, as long as such material is sufficiently non-conductive.

Figure 4:
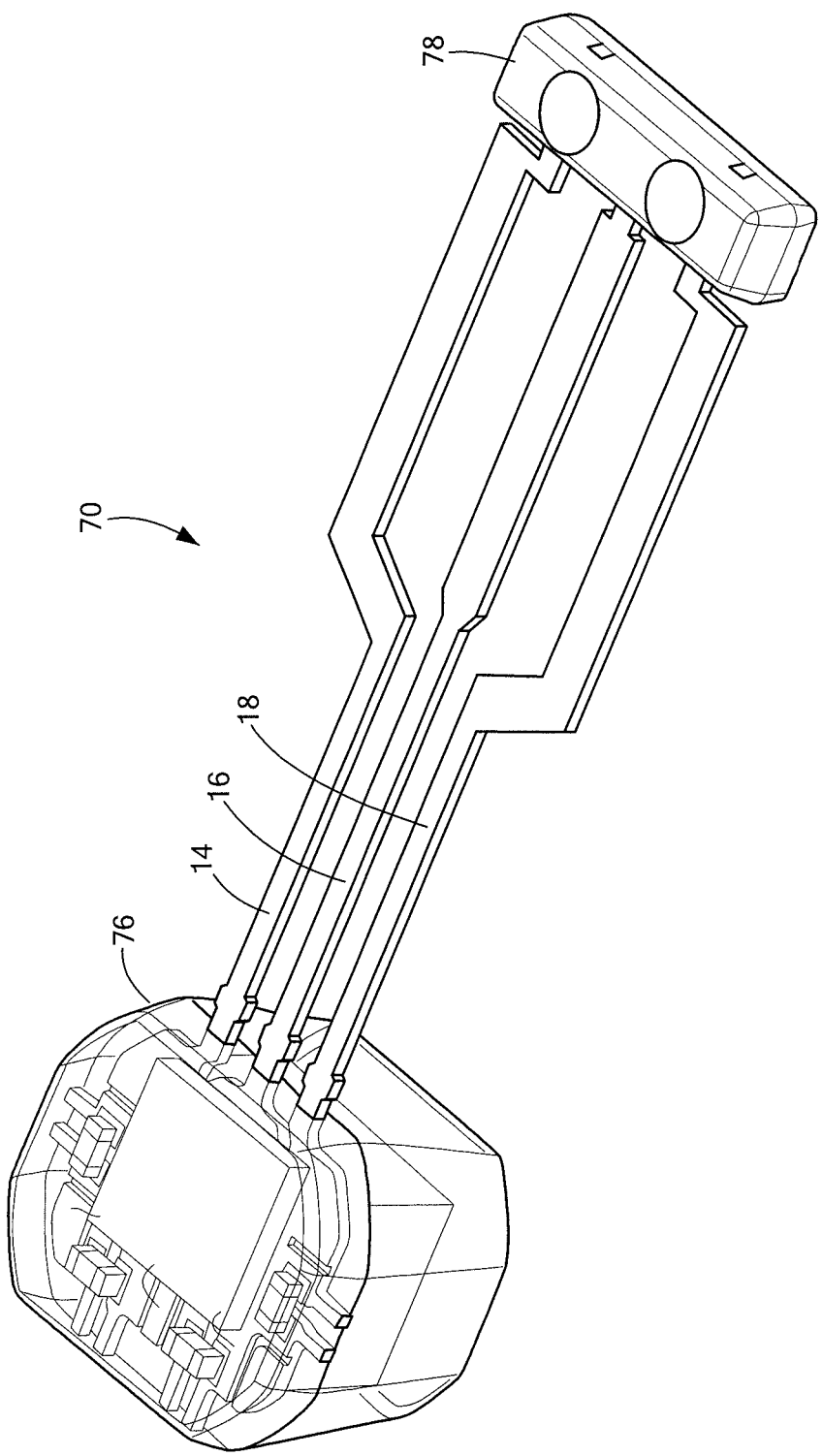
FIG. 4 is a perspective view of the packaged magnetic field sensor integrated circuit of FIG. 3.

Referring also to the perspective view of the integrated circuit sensor 70 of FIG. 4, a further non-conductive mold material 78 is provided to enclose a distal end of the lead frame 10, including the extended regions 50 in order to provide a carrier that can be used to hold the integrated circuit 70 during handling and assembly and also to help maintain coplanarity of the leads after singulation or separation from the lead frame. It will be appreciated by those of ordinary skill in the art that the enclosure 78 may be removed prior to connecting the integrated circuit 70 to a printed circuit board for example. The tie bars 46, 48 are removed during manufacture in a process sometimes referred to as "singulation" in order to prevent shorting of the leads and to thereby provide the packaged magnetic field sensor integrated circuit 70 shown in FIG. 4.

While not shown in the view of FIG. 4, it will be appreciated that the leads 14, 16, 18 may be bent, depending on the orientation of the system (e.g., circuit board) to which the IC 70 is being connected and the desired orientation of the magnetic field sensing element 44 relative to external target being sensed. Notably, the diameter (as defined by a circle enclosing the non-conductive mold material enclosure 76 and the leads exposed from that angle, for example a top-view) is small, such as on the order of 6.0 mm to 7.0 mm in one illustrative embodiment and more generally between approximately 5.0 mm and 9.0 mm. This small volume/diameter package is attributable at least in part to the split lead frame design. In other words, because the die 40 is attached across die attach portions 24, 26, 28 of multiple leads, a contiguous, generally larger area dedicated for attachment of the die is not required. The described package system includes one or more passive components, such as capacitors 60, 64 and resistors 72, 74 which may form a passive network to reduce the overall size of a sensor system when compared to a package that requires an external attachment of the passive network that typically would occur on a PC board which would generally result in a larger diameter of the sensor assembly.

Referring also to the cross-sectional side view of FIG. 5, an alternative packaged integrated circuit magnetic field sensor 80, in which like elements are labeled with like reference characters, includes lead frame 10, die 40, die attachment mechanism 42, passive component 60 and passive attachment mechanism 30. The sensor 80 differs from sensor 70 in that sensor 80 includes a separately formed ferromagnetic element in the form of a concentrator (soft ferromagnetic material) 84 attached adjacent to a surface 10b of the lead frame 10 and to which a further ferromagnetic element in the form of magnet 86 is attached, as shown.

Concentrator 84 may comprise a soft ferromagnetic material. In some embodiments, it may be desirable for the soft ferromagnetic material to have a relatively low coercivity and high permeability. Suitable soft ferromagnetic materials include, but are not limited to permalloy, NiCo alloys, NiFe alloys, steel, nickel, soft ferromagnetic ferrites, and molded soft ferromagnetic materials.

The concentrator 84 may be formed by various processes, such as by compression molding, injection molding, and transfer molding, and potting. An attachment mechanism 88 may be provided to attach the concentrator 84 to the lead frame surface 10b. Suitable attachment mechanisms may be the same as or similar to the magnet attachment mechanism 68 discussed above. Alternatively, the concentrator may be integrally formed with the sensor, such as by a molding process.

The magnet 88 may be the same as or similar to the magnet 66 of FIGS. 2-4 and the magnet attachment mechanism 90 may be the same as or similar to the magnet attachment mechanism 68. Attachment mechanisms 88 and 90 are not required to be the same and while shown as one layer may include multiple layers or techniques to improve electrical isolation or mechanical connections.

During overmolding, a non-conductive mold material is used to provide enclosure 76 to enclose the semiconductor die 40, passive component 60, concentrator 84, magnet 86, and a portion of the leads 14, 16, 18 including the respective die attach portions 24, 26, 28.

Referring also to the cross-sectional side view of FIG. 6, another alternative packaged integrated circuit magnetic field sensor 100, in which like elements are labeled with like reference characters, includes lead frame 10, die 40, die attachment mechanism 42, passive component 60 and passive attachment mechanism 30. The sensor 100 differs from sensor 80 (FIG. 5) only in that the location of the concentrator 84 (and the associated attachment mechanism 88) and the magnet 66 (and its associated attachment mechanism 68) are reversed such that the magnet 66 is positioned between the concentrator 84 and the lead frame 10.

Referring also to the cross-sectional side view of FIG. 7, a further alternative packaged integrated circuit magnetic field sensor 110, in which like elements are labeled with like reference characters, includes lead frame 10, die 40, die attachment mechanism 42, passive component 60 and passive attachment mechanism 30. The sensor 110 differs from the sensor 70 (FIG. 3 for example) in that sensor 110 includes a further ferromagnetic element in the form of concentrator 84 attached to the lead frame 10 with an attachment mechanism 88. More particularly, the concentrator 84 is attached adjacent to a surface 10a of the lead frame 10 opposite to the lead frame surface 10b to which the magnet 66 is attached and thus, is positioned between the lead frame 10 and the die 40, as shown. The die 40 is attached to the concentrator 84 by die attachment mechanism 42. In other embodiments, concentrator 84 may be a permanent magnet as opposed to a soft ferromagnetic material.

Referring also to the cross-sectional side view of FIG. 8, a still further alternative packaged integrated circuit magnetic field sensor 120, in which like elements are labeled with like reference characters, includes lead frame 10, die 40, die attachment mechanism 42, passive component 60 and passive attachment mechanism 30. The sensor 120 differs from the sensor 70 (FIG. 3 for example) in that the sensor 120 includes a ferromagnetic element in the form of magnet 124 that is positioned adjacent to the same surface of the lead frame 10 as the die 40. More particularly, magnet 124 is attached to the lead frame surface 10a with magnet attachment mechanism 68 and the die 40 is attached to the magnet 124 with die attachment mechanism 42, such that the magnet 124 is positioned between the lead frame 10 and the die 40, as shown. The magnet 124 may be the same as or similar to magnet 66, but may be somewhat smaller than magnet 66 and thus, the overmold enclosure 126, which may generally be the same as or similar to enclosure 76, may be somewhat smaller than enclosure 76, as shown. In other embodiments, ferromagnetic element 124 may be a concentrator.

Figure 9:
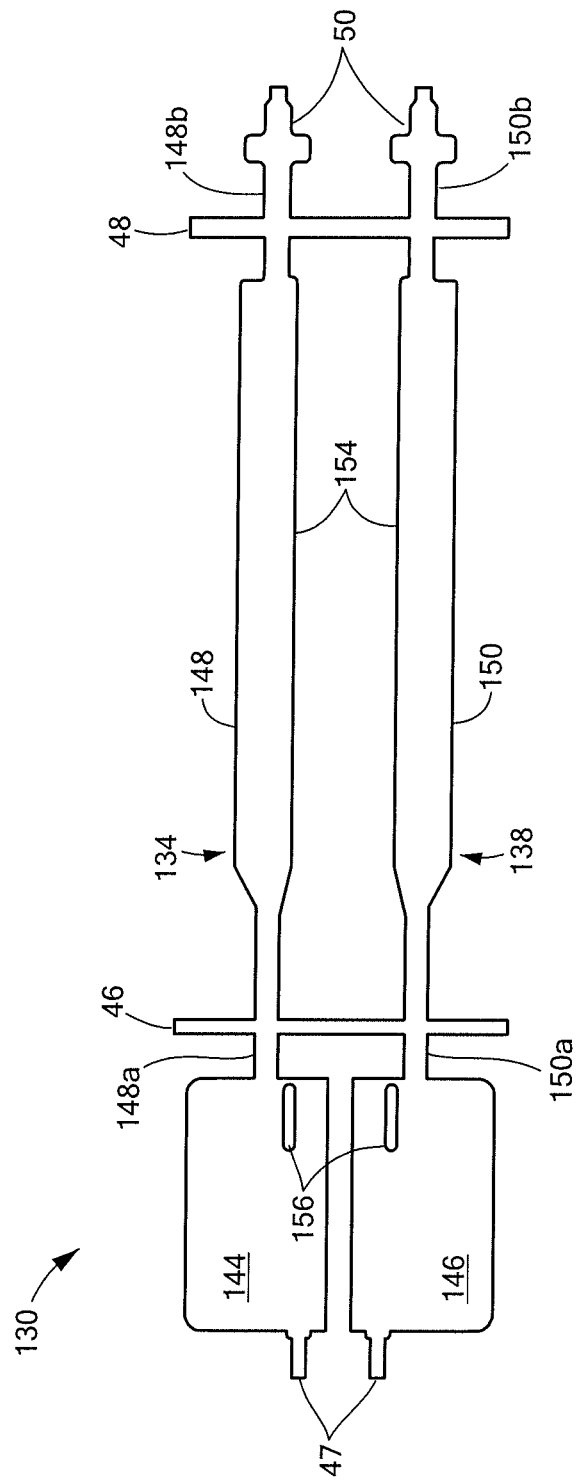
FIG. 9 is a plan view of an alternative split lead frame.

Referring also to FIG. 9, an alternative lead frame 130 for use in an integrated circuit, in which like elements to FIG. 1 are labeled with like reference characters, includes a plurality of leads and here, two leads 134, 138, each of which includes a respective die attach portion 144, 146 and connection portion 148, 150. The die attach portion 144, 146 of the leads can have a semiconductor die 160 (FIG. 10) attached thereto.

The connection portion 148, 150 of the leads extends from a first end 148a, 150a proximate to the respective die portion 144, 146 to a second, distal end 148b, 150b distal from the die portion. Generally, the connection portion 134, 138 of the leads is elongated (although may be bent to accommodate connection configurations) and is suitable for making electrical connection to electronic systems and components (not shown) outside of the integrated circuit package, such as a power source or microcontroller.

An integrated circuit sensor utilizing the lead frame 130 of FIG. 9 can be referred to as a two-wire sensor requiring electrical connections of power and ground only via the two leads 134, 138. In such embodiments, the sensor output signal is provided the form of a current signal.

The lead frame 130 includes tie bars 46, 47, 48 that hold the leads 134, 138 together during manufacture, as described above. The lead frame 130 further includes extended regions 50 that can be overmolded with non-conductive mold material (similar to FIG. 4) to help maintain lead co-planarity with electrical isolation after the tie bars have been cut or the package has been singulated to form the lead frame during manufacturing. The connection portion 134, 138 of the leads may have widened regions 154 (similar to regions 38 in FIG. 1) in order to further facilitate handling of the integrated circuit during assembly and improve the strength of the leads.

The lead frame 130 may be formed from materials and by techniques described above in connection with FIG. 1 and can have the same or similar dimensions to the lead frame of FIG. 1. The die attach portion of one or more of the leads can further include at least one separating feature 156 to separate areas of a die attach portion from each other as described above in connection with separating features 32 (FIG. 1). Although not shown, lead frame 130 can have one or more slots.

Figure 10:
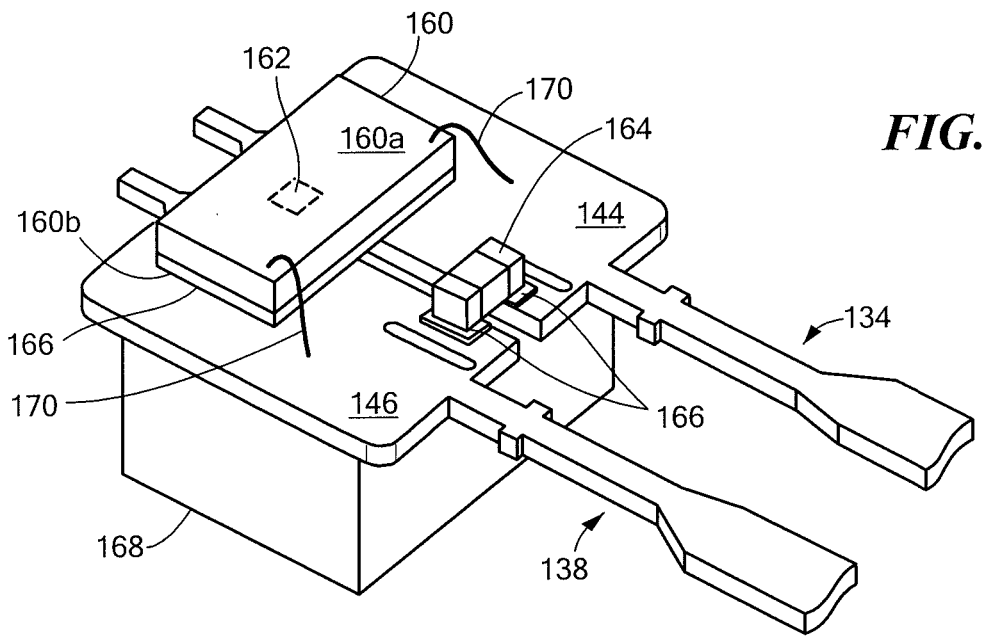
FIG. 10 is a perspective view of a magnetic field sensor integrated circuit subassembly containing the split lead frame of FIG. 9 and including a magnet.

Referring also to FIG. 10, at a later stage of manufacture, a semiconductor die 160 can be attached to the lead frame 130. Here again, the lead frame 130 does not have a conventional contiguous die attach pad or area to which the die is attached, but rather the die is attached to die portions 144, 146 and thus to a non-contiguous surface. Accordingly, the lead frame 130 can be referred to as a "split lead frame" since there is not a contiguous die attach surface. The semiconductor die 160 has a first surface 160a in which a magnetic field sensing element 162 is disposed and a second, opposing surface 160b. As in the above-described embodiment, the die 160 may be attached to the die attach portions 144, 146 in a die up arrangement, a flip-chip arrangement, or a lead on chip arrangement.

A die attach mechanism 166 is used to attach the die 160 to the die attach portions 144, 146 and can be the same as or similar to the die attachment mechanism 42 (FIG. 2). Wire bonds 170 can be used to electrically couple the die circuitry to the lead frame 130, although other electrical connection schemes such as solder balls, solder bumps, pillar bumps are possible, particularly in a flip-chip configuration.

The integrated circuit shown during manufacture in FIG. 10 can include at least one integrated passive component that can be the same as or similar to passive components shown and described above. In the illustrative embodiment of FIG. 10, a passive component 164, such as a capacitor, is coupled between die attach portions 144, 146 with passive attachment mechanism 166 that may be the same as or similar to attachment mechanism 30 (FIG. 2). It will also be appreciated that the die attach portion of one or more of the leads can be separated into multiple portions with one or more passive components coupled therebetween and thus in series with the lead (e.g., like components 72, 74 of FIG. 2). In this situation, the die 198 can be attached to at least two of the die attach portions or separated die attach portions.

The integrated circuit subassembly shown during manufacture in FIG. 10 further includes a separately formed ferromagnetic element 168 adjacent to the lead frame 130. Ferromagnetic element 168 can be the same as or similar to element 66 of FIG. 2 and can be attached to the lead frame with a die attachment mechanism like mechanism 68 of FIG. 3.

Although not shown in the view of FIG. 10, the illustrated sensor subassembly is overmolded to provide a non-conductive enclosure like enclosure 76 of FIG. 4. Furthermore, the extended regions 50 (FIG. 9) can be overmolded to form a second enclosure like enclosure 78 of FIG. 4.

Figure 11:
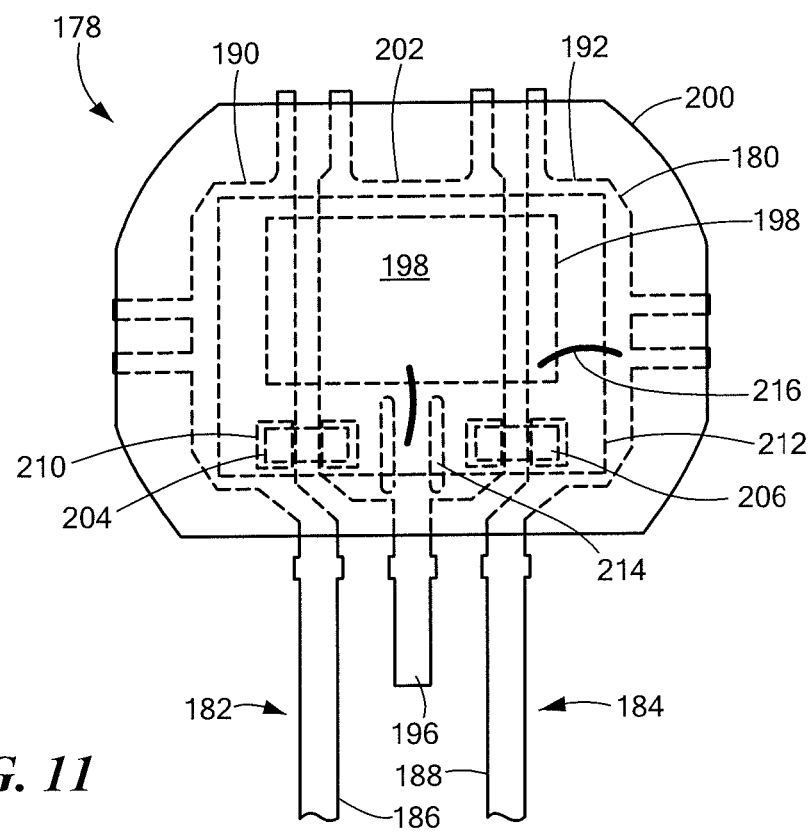
FIG. 11 is a plan view of another alternative split lead frame.

Referring also to FIG. 11, an alternative integrated circuit sensor 178 is shown to include a split lead frame 180. The sensor 178 is considered to be a two-wire sensor since only two leads 182, 184 of the lead frame have respective connection portions 186, 188 suitable for external connection, such as to a printed circuit board. A third lead 196 can be referred to as a no connect lead as it is trimmed near the overmold enclosure 200 and thus, this third lead can be described as having a die attach portion 202, but no useable connection portion. Leads 182, 184 have respective die attach portions 190, 192.

A semiconductor die 198 can be attached to the die attach portion of at least two of the leads. Here, the die 198 is attached to the die attach portions 190, 192, 202, as shown. However, it will be appreciated that the die 198 can be attached to the die attach portions of only two of the leads. It will also be appreciated that the die attach portion of one or more of the leads can be separated into multiple portions with one or more passive components coupled therebetween and thus in series with the lead (e.g., like components 72, 74 of FIG. 2). In this situation, the die 198 can be attached to at least two of the die attach portions or separated die attach portions.

The illustrated sensor 178 includes at least one, and here two, passive components coupled between die attach portions. Specifically, a first component 204 is coupled between die attach portions 190 and 202 and a second component 206 is coupled between die attach portions 202 and 192. The passive components can be the same as or similar to components 60, 64 of FIG. 2 and attached in the same or a similar manner with passive attachment mechanisms 210. As one example, passive component 204 may be a resistor and passive component 206 may be a capacitor.

The lead frame 182 can have separating features, here labeled 214, that can be the same as or similar to separating features 32 of FIG. 1. Wire bonds 216 are illustrated to provide electrical connection between the die 198 and the die portions 190, 192, 202, but alternative electrical connection schemes could be used. The sensor 178 further includes a ferromagnetic element 212 that can be the same as or similar to the magnet 66 of FIG. 2 and can be attached to a surface of the lead frame opposite to the surface to which the die is attached with a die attachment mechanism like mechanism 68 of FIG. 3. The integrated circuit sensor 178 is overmolded with a non-conductive mold material to provide enclosure 200 like enclosure 76 (FIG. 4).

Having described preferred embodiments of the invention it will now become apparent to those of ordinary skill in the art that other embodiments incorporating these concepts may be used.

For example, it will be appreciated by those of ordinary skill in the art that the package types, shapes, and dimensions, can be readily varied to suit a particular application both in terms of the electrical and magnetic requirements as well as any packaging considerations. It will also be appreciated that the various features shown and described herein in connection with the various embodiments can be selectively combined. For example, any of the lead frame embodiments (FIGS. 1, 9 and 11) can be used with any of the ferromagnetic element configurations (FIGS. 3, 5-8).

Accordingly, it is submitted that that the invention should not be limited to the described embodiments but rather should be limited only by the spirit and scope of the appended claims. All publications and references cited herein are expressly incorporated herein by reference in their entirety.

What is claimed is:

1. A magnetic field sensor comprising:
   a lead frame having a first surface, a second opposing surface, and comprising a plurality of leads, wherein at least two of the plurality of leads are electrically isolated from each other and wherein each of the at least two leads has an elongated connection portion and a die attach portion;
   a semiconductor die supporting a magnetic field sensing element and attached to the die attach portions of the at least two leads adjacent to the first surface of the lead frame with a non-conductive attachment mechanism;
   a separately formed ferromagnetic element disposed adjacent to the lead frame; and
   a passive component coupled to the at least two leads, wherein the die attach portion of at least one of the plurality of leads has a first portion that is separated from a second portion and wherein the magnetic field sensor further comprises a passive component coupled between the first portion and second portion of the die attach portion.

2. The magnetic field sensor of claim 1 wherein the ferromagnetic element comprises at least one of a sintered element or a molded element.

3. The magnetic field sensor of claim 1 wherein the ferromagnetic element is attached adjacent to the second surface of the lead frame.

4. The magnetic field sensor of claim 3 further comprising an attachment mechanism to attach the ferromagnetic element to the second surface of the lead frame.

5. The magnetic field sensor of claim 4 wherein the attachment mechanism comprises one or more of a non-conductive adhesive, epoxy, tape, film or spray.

6. The magnetic field sensor of claim 1 wherein the ferromagnetic element is comprised of a hard ferromagnetic material to form a permanent magnet.

7. The magnetic field sensor of claim 6 further comprising a second ferromagnetic element comprised of a soft ferromagnetic material.

8. The magnetic field sensor of claim 7 wherein the second ferromagnetic element is disposed adjacent to a surface of the lead frame opposite a surface of the lead frame to which the ferromagnetic element comprising a hard ferromagnetic material is disposed.

9. The magnetic field sensor of claim 7 wherein the second ferromagnetic element is disposed adjacent to the ferromagnetic element comprising a hard ferromagnetic material.

10. The magnetic field sensor of claim 1 wherein the ferromagnetic element is comprised of a soft ferromagnetic material to form a concentrator.

11. The magnetic field sensor of claim 10 further comprising a second ferromagnetic element comprised of a hard ferromagnetic material.

12. The magnetic field sensor of claim 1 further comprising a non-conductive mold material enclosing the semiconductor die and the die attach portion of the at least two leads.

13. The magnetic field sensor of claim 1 wherein the passive component is a capacitor.

14. The magnetic field sensor of claim 1 wherein the passive component is coupled to the die attach portion of the at least two leads.

15. The magnetic field sensor of claim 14 further comprising at least two passive components, each coupled between a respective pair of die attach portions.

16. The magnetic field sensor of claim 1 wherein the passive component is coupled to the connection portion of the at least two leads.

17. The magnetic field sensor of claim 1 wherein the passive component is a resistor.

18. The magnetic field sensor of claim 1 wherein the semiconductor die has a first surface in which the magnetic field sensing element is disposed and a second, opposing surface and wherein the second, opposing surface is attached to the die attach portion of the at least two leads.

19. The magnetic field sensor of claim 1 wherein the die attach portion of the at least two leads are spaced from each other.

20. The magnetic field sensor of claim 1 further comprising an electrical component supported by the semiconductor die.

21. The magnetic field sensor of claim 1 wherein the die attach portion of at least one of the plurality of leads comprises a separating feature to separate areas of the die attach portion from each other.

22. The magnetic field sensor of claim 21 wherein the die attach portion comprises at least two separating features and wherein an electrical connection is made from the semiconductor die to an area of the die attach portion between the at least two separating features.

23. The magnetic field sensor of claim 1 wherein the magnetic field sensing element comprises a Hall effect element.

24. The magnetic field sensor of claim 1 wherein the magnetic field sensing element comprises a magnetoresistive element.

25. The magnetic field sensor of claim 24 wherein the magnetoresistive element comprises one or more of a GMR element, a AMR element, a TMR element, and a MTJ element.

26. The magnetic field sensor of claim 1 wherein the non-conductive attachment mechanism comprises one or more of a non-conductive adhesive, epoxy, tape, film, or spray.

27. A magnetic field sensor comprising:
a lead frame having a first surface, a second opposing surface, and comprising a plurality of leads, wherein at least two of the plurality of leads are electrically isolated from each other and wherein each of the at least two leads has an elongated connection portion and a die attach portion;
a magnet attached to the die attach portions of the at least two leads adjacent to the first surface of the lead frame; and
a semiconductor die supporting a magnetic field sensing element and attached to the magnet and spaced from the lead frame by the magnet.

28. The magnetic field sensor of claim 27 wherein the magnet comprises at least one of a sintered element or a molded element.

29. The magnetic field sensor of claim 27 further comprising an attachment mechanism to attach the magnet to the second surface of the lead frame.

30. The magnetic field sensor of claim 29 wherein the attachment mechanism comprises one or more of a non-conductive adhesive, epoxy, tape, film or spray.

31. The magnetic field sensor of claim 27 further comprising a non-conductive mold material enclosing the semiconductor die and the die attach portion of the at least two leads.

32. The magnetic field sensor of claim 27 further comprising a passive component coupled to at least two of the plurality of leads.

33. The magnetic field sensor of claim 32 wherein the passive component is a capacitor.

34. The magnetic field sensor of claim 32 wherein the passive component is coupled to the die attach portion of the at least two leads.

35. The magnetic field sensor of claim 34 further comprising at least two passive components, each coupled between a respective pair of die attach portions.

36. The magnetic field sensor of claim 32 wherein the passive component is coupled to the connection portion of the at least two leads.

37. The magnetic field sensor of claim 27 wherein the die attach portion of at least one of the plurality of leads has a first portion that is separated from a second portion and wherein the magnetic field sensor further comprises a passive component coupled between the first portion and second portion of the die attach portion.

38. The magnetic field sensor of claim 37 wherein the passive component is a resistor.

39. The magnetic field sensor of claim 27 wherein the semiconductor die has a first surface in which the magnetic field sensing element is disposed and a second, opposing surface and wherein the second, opposing surface is attached to the die attach portion of the at least two leads.

40. The magnetic field sensor of claim 27 wherein the semiconductor die has a first surface in which the magnetic field sensing element is disposed and a second, opposing surface and wherein the first surface is attached to the die attach portion of the at least two leads.

41. The magnetic field sensor of claim 27 wherein the magnetic field sensing element comprises a Hall effect element.

42. The magnetic field sensor of claim 27 wherein the magnetic field sensing element comprises a magnetoresistive element.

43. The magnetic field sensor of claim 42 wherein the magnetoresistive element comprises one or more of a GMR element, a AMR element, a TMR element, and a MTJ element.

44. The magnetic field sensor of claim 37 wherein the passive component is coupled to the die attach portion of the at least two leads.

45. A magnetic field sensor comprising:
a lead frame having a first surface, a second opposing surface, and comprising a plurality of leads, wherein at least two of the plurality of leads are electrically isolated from each other and wherein each of the at least two leads has an elongated connection portion and a die attach portion;
a semiconductor die supporting a magnetic field sensing element and attached to the die attach portions of the at least two leads adjacent to the first surface of the lead frame with a non-conductive attachment mechanism;
a hard ferromagnetic element adjacent to the second surface of the lead frame; and
a soft ferromagnetic element coupled to the hard ferromagnetic element to form a concentrator.

46. The magnetic field sensor of claim 45 wherein the soft ferromagnetic element is disposed between the second surface of the lead frame and the hard ferromagnetic element.

47. The magnetic field sensor of claim 45 wherein the hard ferromagnetic element is disposed between the second surface of the lead frame and the soft ferromagnetic element.

48. The magnetic field sensor of claim 45 wherein the hard ferromagnetic element comprises at least one of a sintered element or a molded element.

49. The magnetic field sensor of claim 45 further comprising an attachment mechanism to attach the hard ferromagnetic element to the second surface of the lead frame.

50. The magnetic field sensor of claim 49 wherein the attachment mechanism comprises one or more of a non-conductive adhesive, epoxy, tape, film or spray.

51. The magnetic field sensor of claim 45 further comprising a non-conductive mold material enclosing the semiconductor die and the die attach portion of the at least two leads.

52. The magnetic field sensor of claim 45 further comprising a passive component coupled to at least two of the plurality of leads.

53. The magnetic field sensor of claim 52 wherein the passive component is a capacitor.

54. The magnetic field sensor of claim 52 wherein the passive component is coupled to the die attach portion of the at least two leads.

55. The magnetic field sensor of claim 54 further comprising at least two passive components, each coupled between a respective pair of die attach portions.

56. The magnetic field sensor of claim 52 wherein the passive component is coupled to the connection portion of the at least two leads.

57. The magnetic field sensor of claim 45 wherein the die attach portion of at least one of the plurality of leads has a first portion that is separated from a second portion and wherein the magnetic field sensor further comprises a passive component coupled between the first portion and second portion of the die attach portion.

58. The magnetic field sensor of claim 57 wherein the passive component is a resistor.

59. The magnetic field sensor of claim 45 wherein the magnetic field sensing element comprises a Hall effect element.

60. The magnetic field sensor of claim 45 wherein the magnetic field sensing element comprises a magnetoresistive element.

61. The magnetic field sensor of claim 60 wherein the magnetoresistive element comprises one or more of a GMR element, a AMR element, a TMR element, and a MTJ element.

62. The magnetic field sensor of claim 57 wherein the passive component is coupled to the die attach portion of the at least two leads.

63. The magnetic field sensor of claim 45 wherein the non-conductive attachment mechanism comprises one or more of a non-conductive adhesive, epoxy, tape, film, or spray.

* * * * *